United States Patent
Foo et al.

[11] Patent Number: 6,025,732
[45] Date of Patent: *Feb. 15, 2000

[54] REUSABLE DIE CARRIER FOR BURN-IN AND BURN-IN PROCESS

[75] Inventors: See-Hack Foo, Fremont; Rhea Posedel, Belmont; Larry Lape, Mountain View; James Wrenn, Palo Alto; Ernie Wang, San Mateo; Paul Burke, Hayward; Carl Buck, Cupertino, all of Calif.

[73] Assignee: AEHR Test Systems, Mountain View, Calif.

[*] Notice: This patent is subject to a terminal disclaimer.

[21] Appl. No.: 08/948,696

[22] Filed: May 6, 1997

Related U.S. Application Data

[63] Continuation-in-part of application No. 08/645,343, May 13, 1996, abandoned, which is a continuation-in-part of application No. 08/089,752, Jul. 9, 1993, Pat. No. 5,517,125.

[51] Int. Cl.$^7$ .................................................... G01R 31/02
[52] U.S. Cl. ......................... 324/760; 324/755; 324/761; 439/72
[58] Field of Search .................................. 324/760, 754, 324/755, 757, 758, 158.1; 439/72, 73, 70, 266, 330, 331, 264, 525, 526

[56] References Cited

U.S. PATENT DOCUMENTS

| | | | |
|---|---|---|---|
| 4,758,176 | 7/1988 | Abe et al. | 439/72 |
| 5,100,332 | 3/1992 | Egawa | 439/72 |
| 5,205,742 | 4/1993 | Goff et al. | 439/73 |
| 5,326,271 | 7/1994 | Kishi et al. | 439/72 |
| 5,360,348 | 11/1994 | Johnson | 439/72 |
| 5,395,255 | 3/1995 | Kato | 439/72 |
| 5,402,077 | 3/1995 | Agahdel et al. | 324/758 |
| 5,420,520 | 5/1995 | Anschel et al. | 324/754 |
| 5,447,448 | 9/1995 | Noriyuki | 439/331 |
| 5,470,247 | 11/1995 | Fuchigami | 439/264 |
| 5,517,125 | 5/1996 | Posedel et al. | 324/760 |
| 5,523,696 | 6/1996 | Charlton et al. | 324/758 |
| 5,659,256 | 8/1997 | Charlton et al. | 324/755 |
| 5,666,064 | 9/1997 | Kasai et al. | 324/755 |
| 5,672,977 | 9/1997 | Yamada | 324/757 X |
| 5,694,049 | 12/1997 | Singh et al. | 324/755 |
| 5,705,933 | 1/1998 | Lim et al. | 324/755 |
| 5,791,915 | 8/1998 | Kubo | 439/73 |
| 5,807,104 | 9/1998 | Ikeya et al. | 324/765 |
| 5,807,118 | 9/1998 | Tsubota | 439/73 |

Primary Examiner—Josie Ballato
Assistant Examiner—T. R. Sundaram
Attorney, Agent, or Firm—Cooley Godward LLP

[57] ABSTRACT

A reusable carrier 10 for temporarily holding an integrated circuit 12 during burn-in and electrical test includes a base 14 and a lid 16 attached to the base 14 by hinges 18. A flexible substrate 19 is attached to the base 14. Alignment posts 20 have tapered surfaces 22 that engage corners 24 of the integrated circuit 12 to position the integrated circuit 12 precisely on upper surface 26 of the substrate 19. A spring-loaded latch 28 engages projection 30 in aperture 32 of the base 14 to hold the lid 16 closed over the integrated circuit 12. Electrically conductive traces 34 on the surface 26 have contact bumps which engage contact pads on the underside of the integrated circuit 12 to connect the integrated circuit 12 to peripheral contact pads 38 around edges 40 of the substrate 19. A spring 42 engages upper surface 43 of the integrated circuit 12 when the lid 16 is in its closed position over the integrated circuit 12, to provide a biasing force to urge the contact pads against the conductive traces 34 with sufficient force to insure a reliable electrical connection. For burn-in, the temporary package 10 containing the integrated circuit die 12 is now loaded into a socket 48 on a burn-in board 50, which is then loaded into a burn-in system, where otherwise standard burn-in is performed.

63 Claims, 21 Drawing Sheets

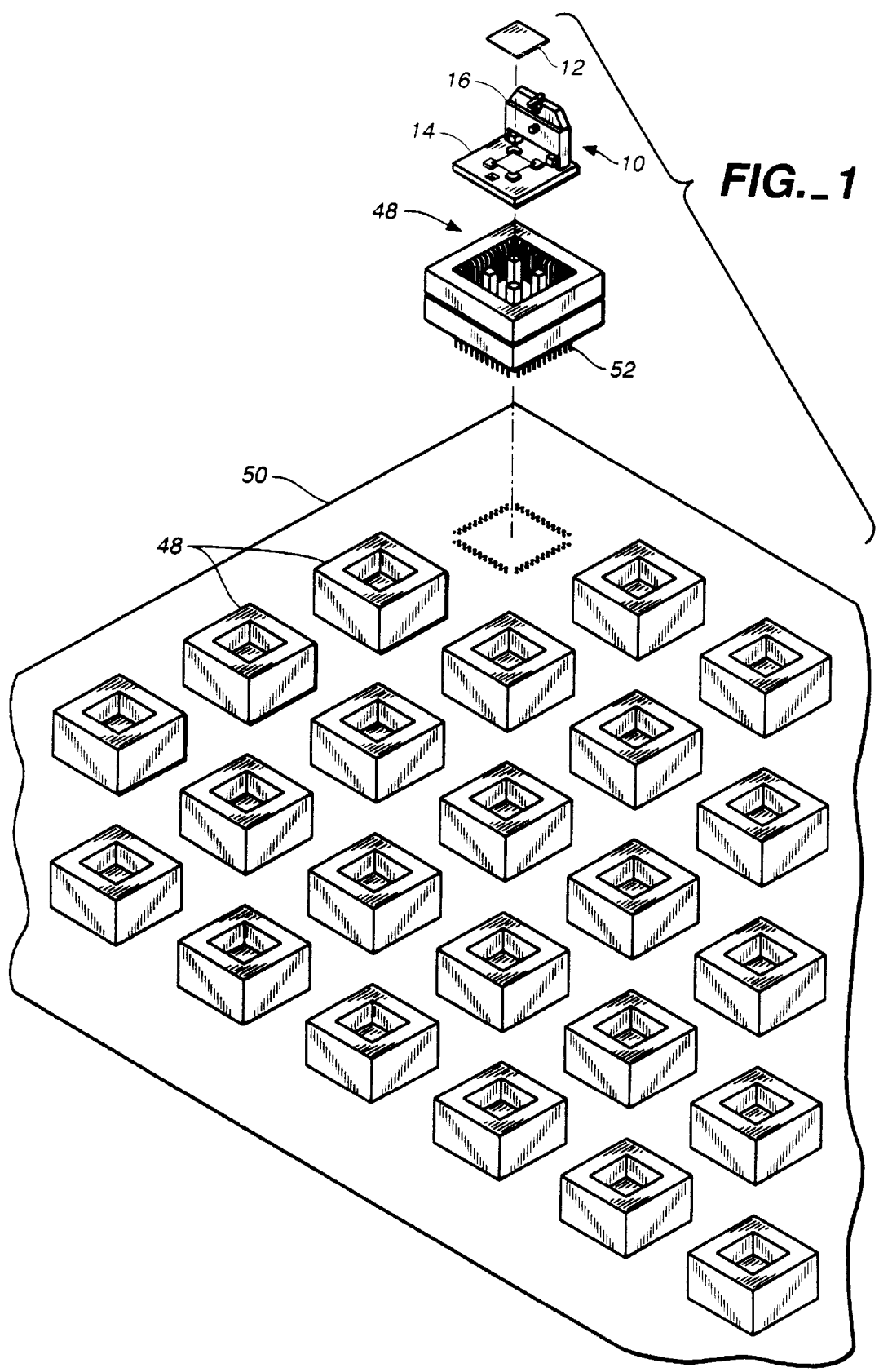
FIG._1

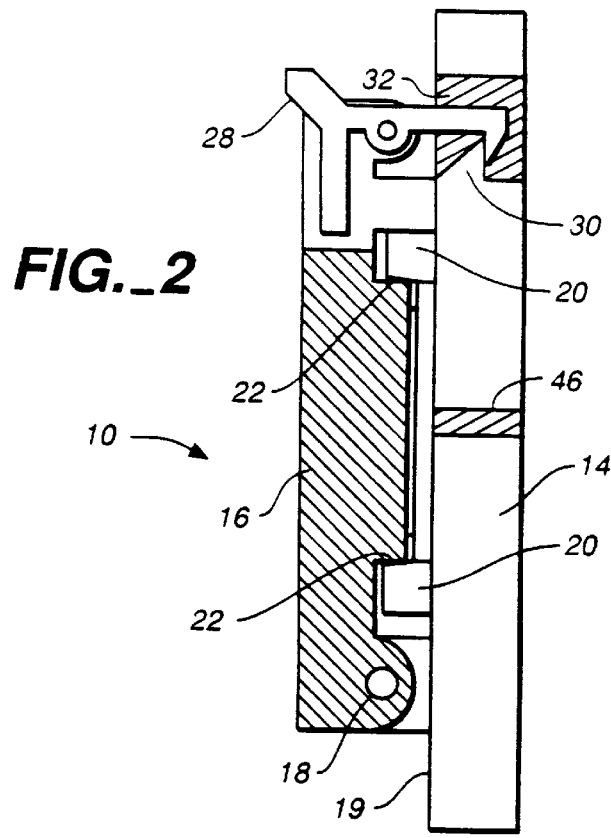
FIG._2
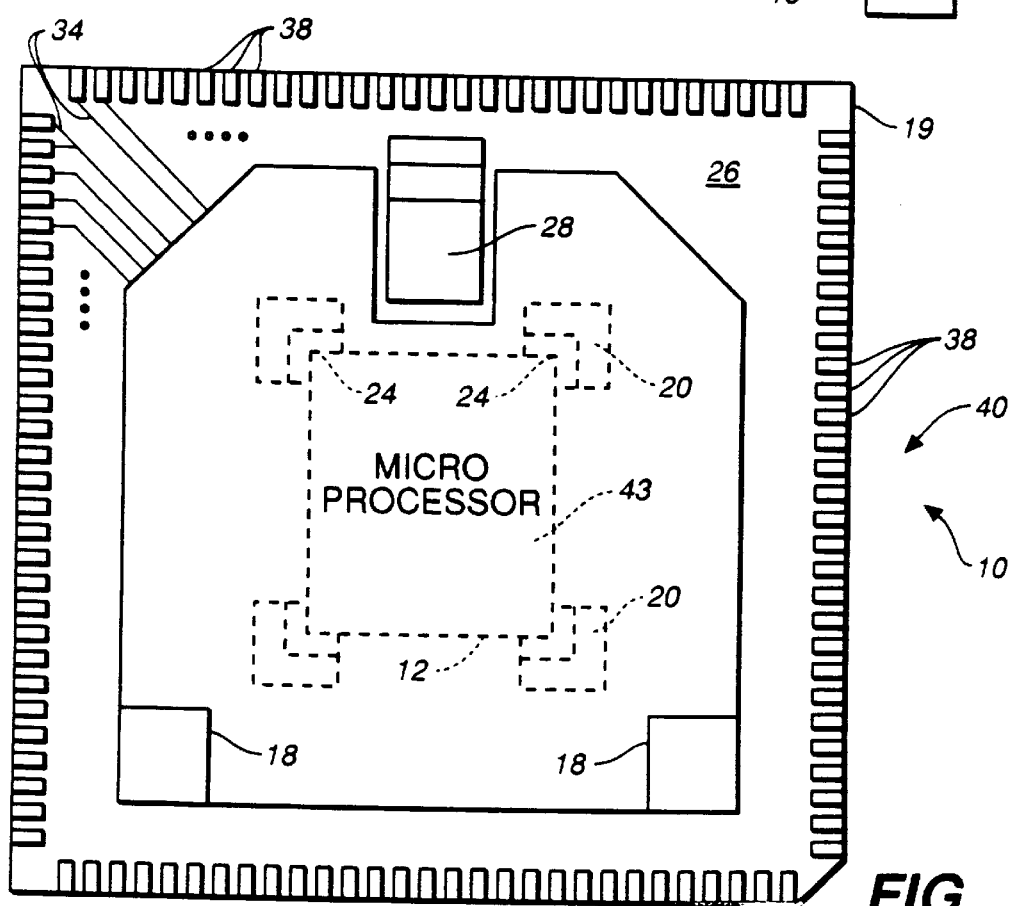
FIG._3

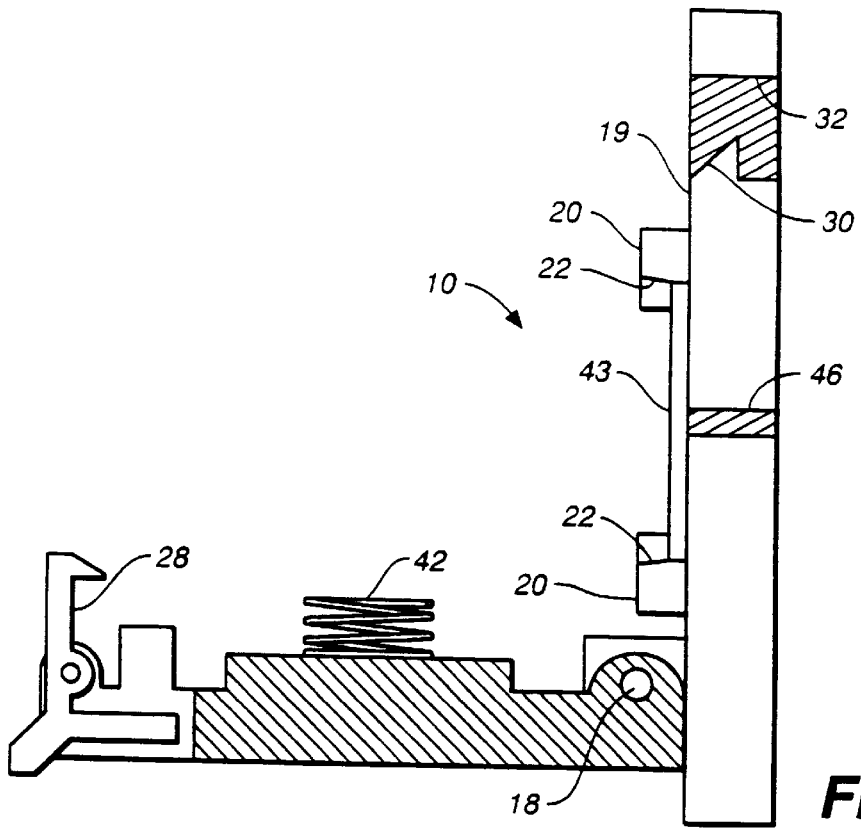
*FIG._4*
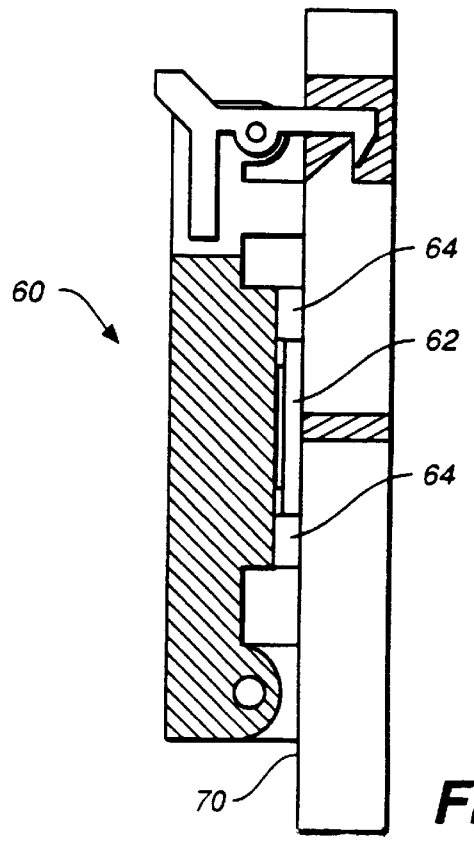
*FIG._5*

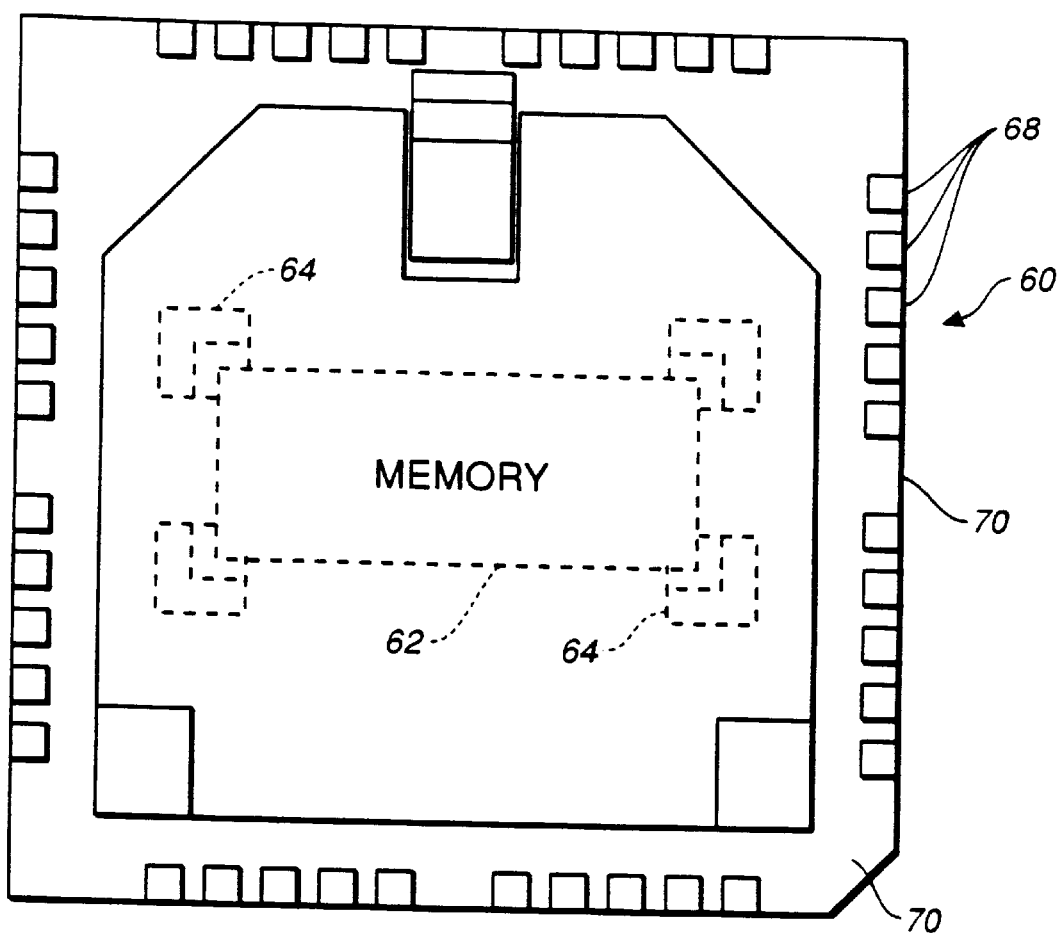
FIG._6
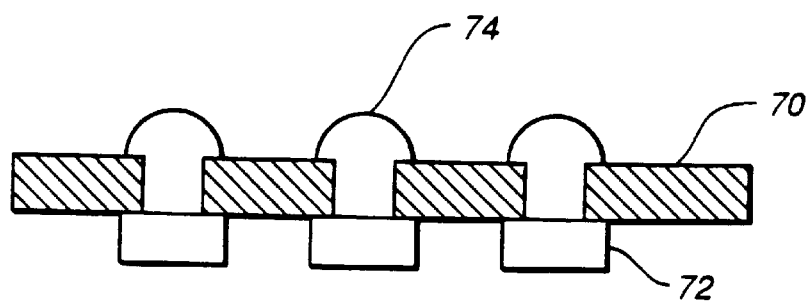
FIG._6B

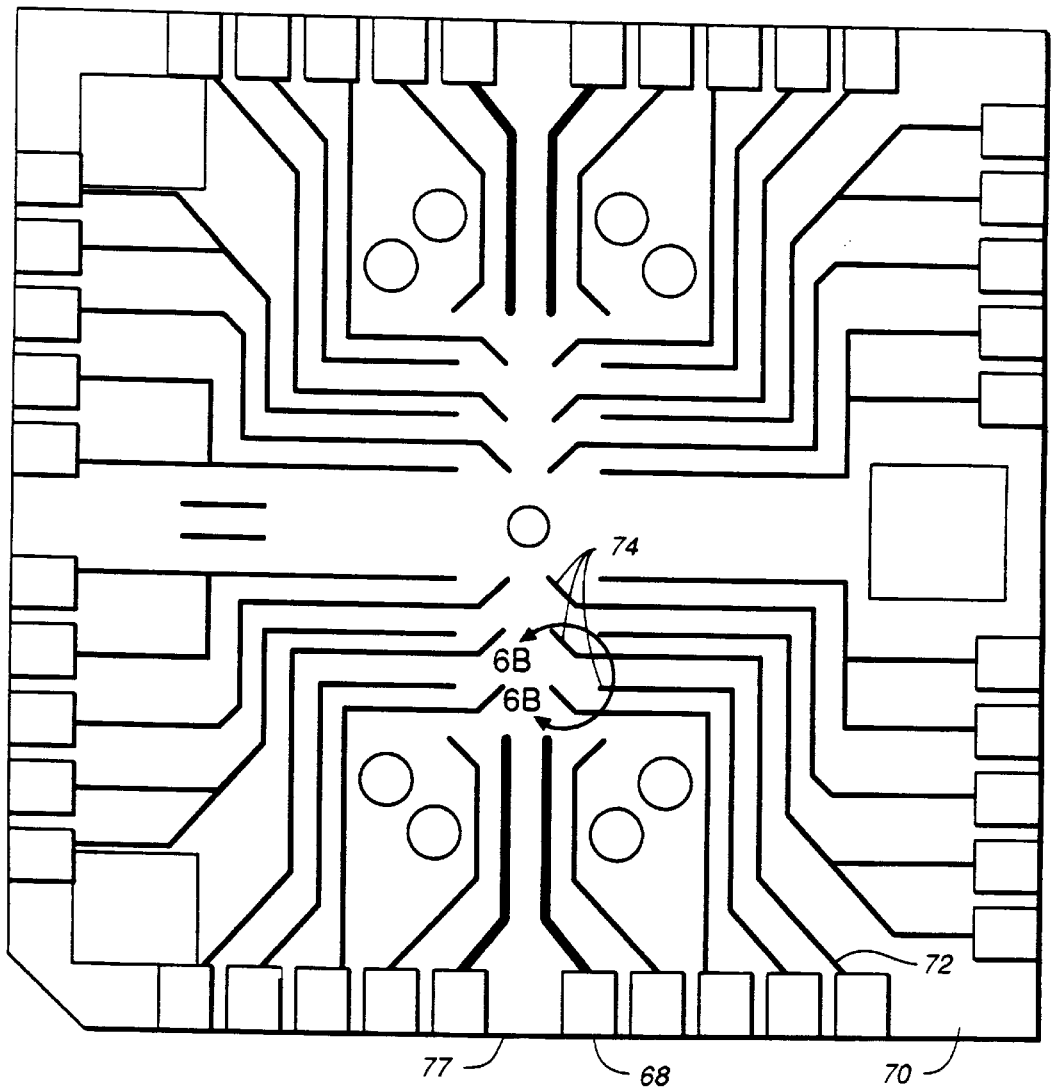
FIG._6A

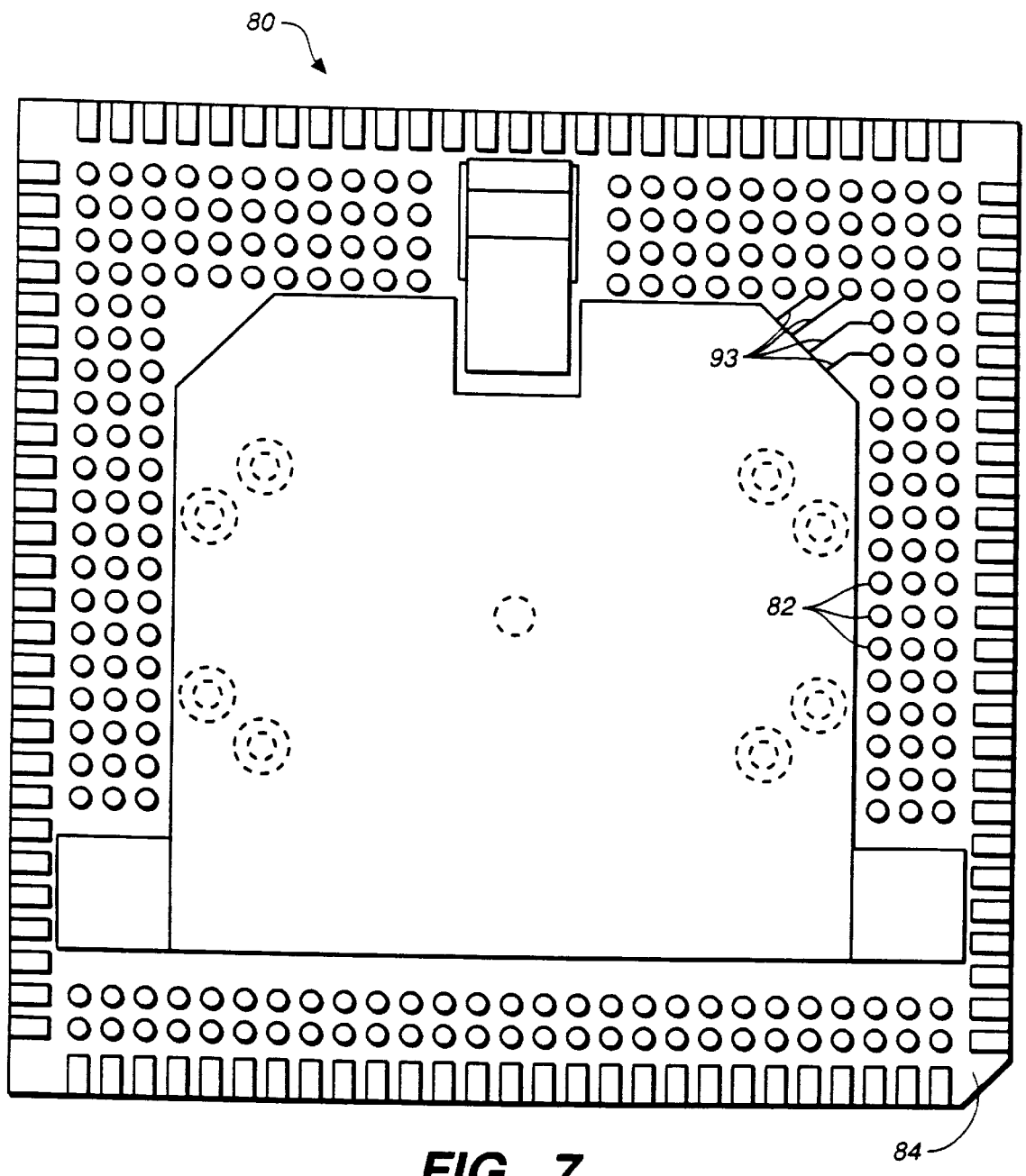
FIG._7

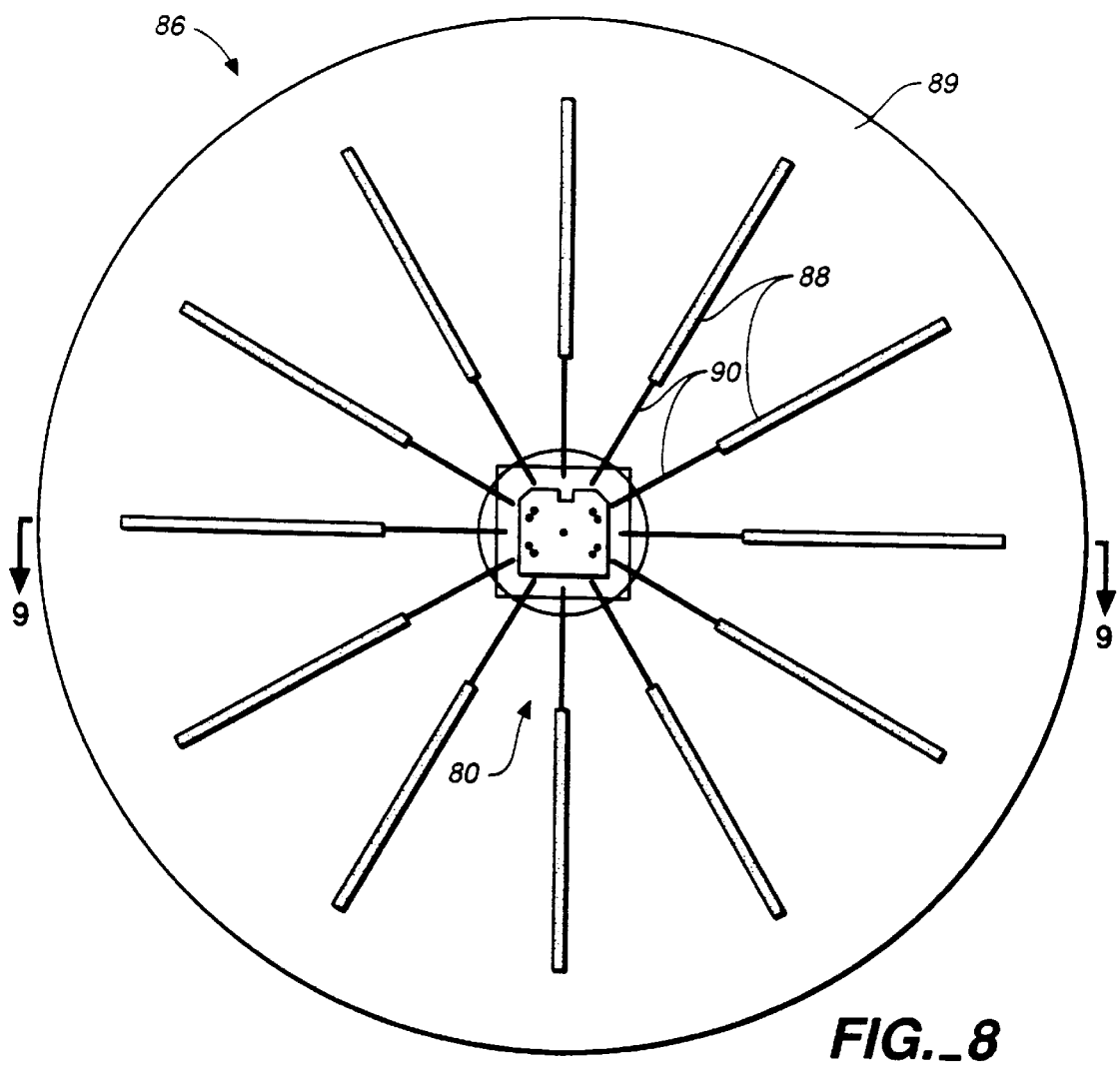
FIG._8
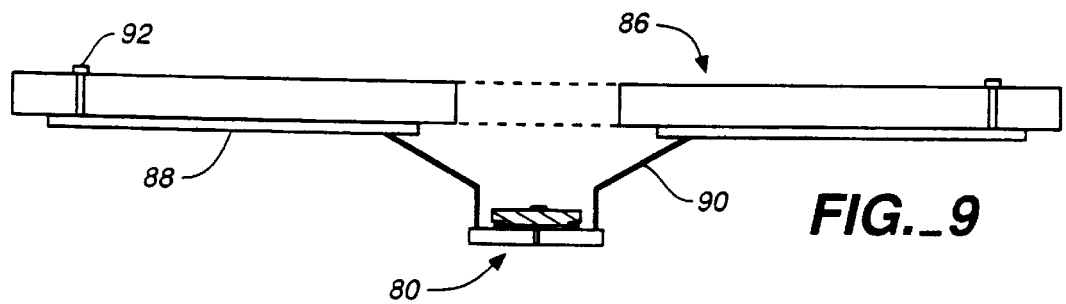
FIG._9

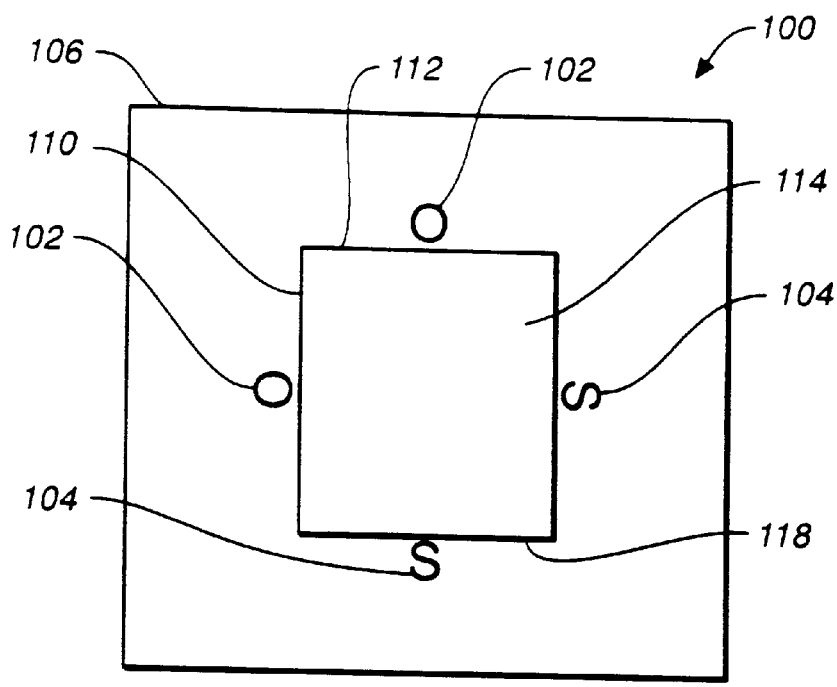
FIG._10
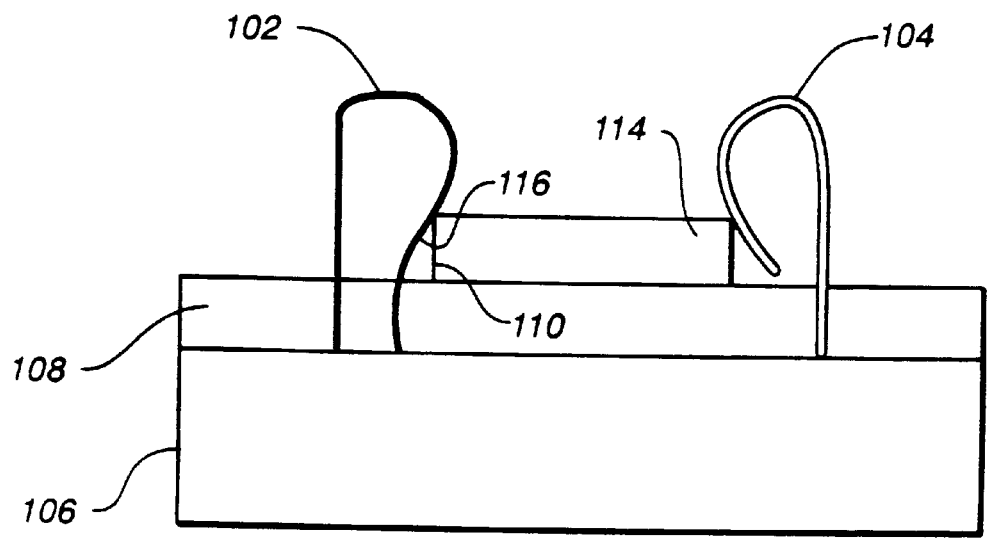
FIG._11

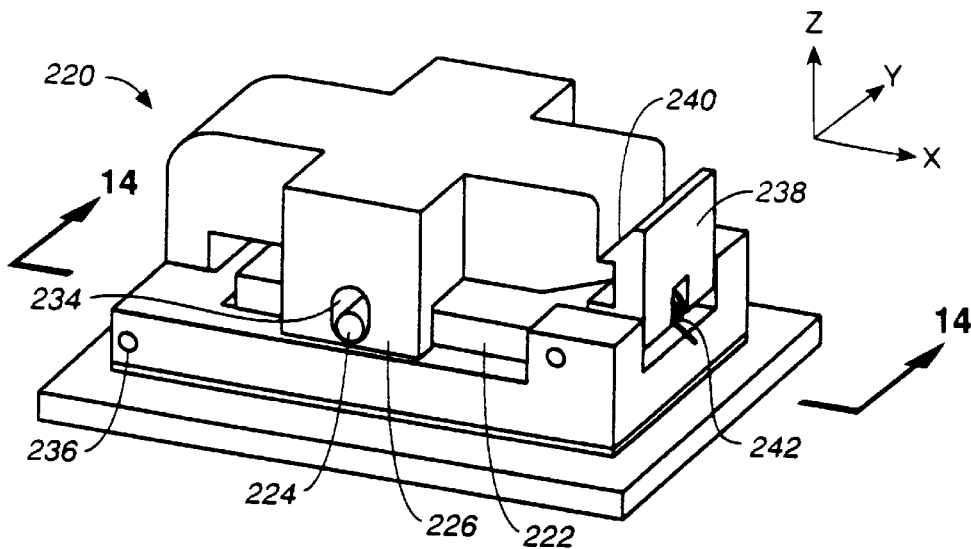
FIG._12
FIG._13

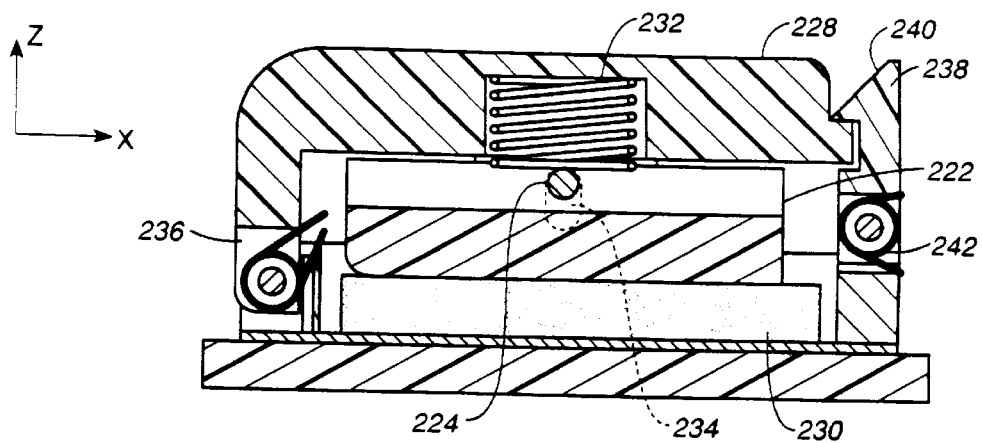
FIG._14
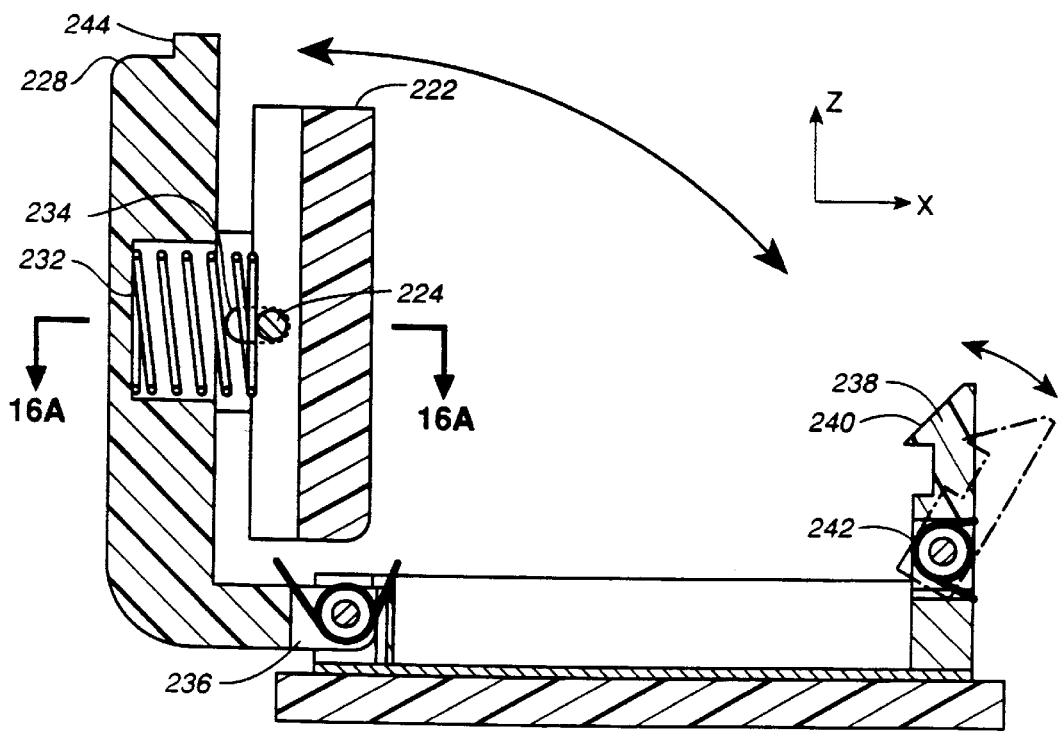
FIG._15

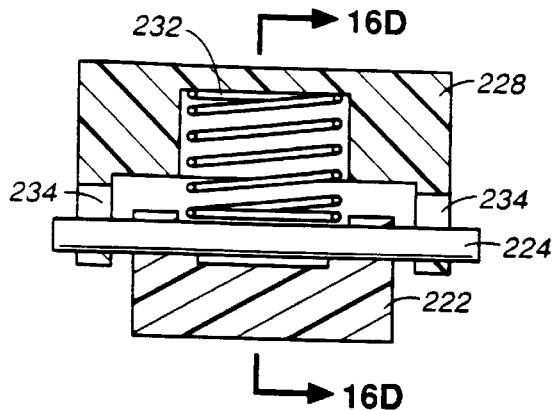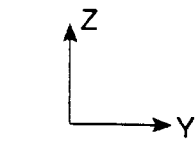
FIG._16A
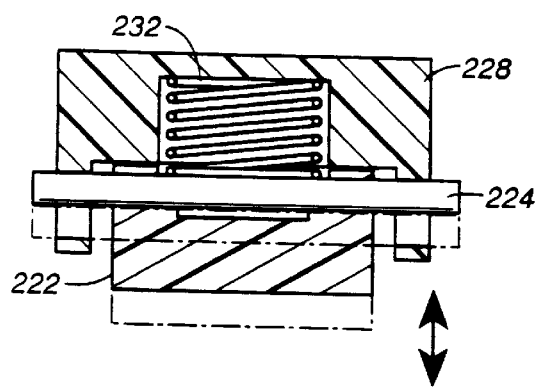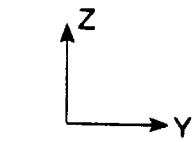
FIG._16B
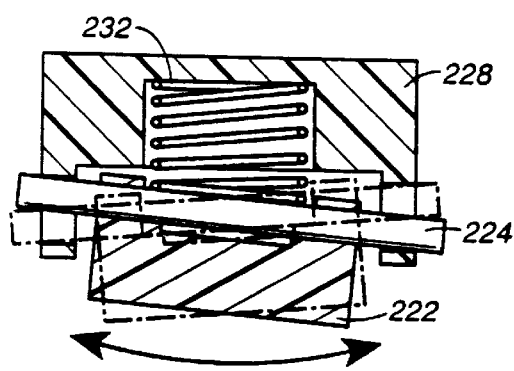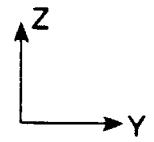
FIG._16C
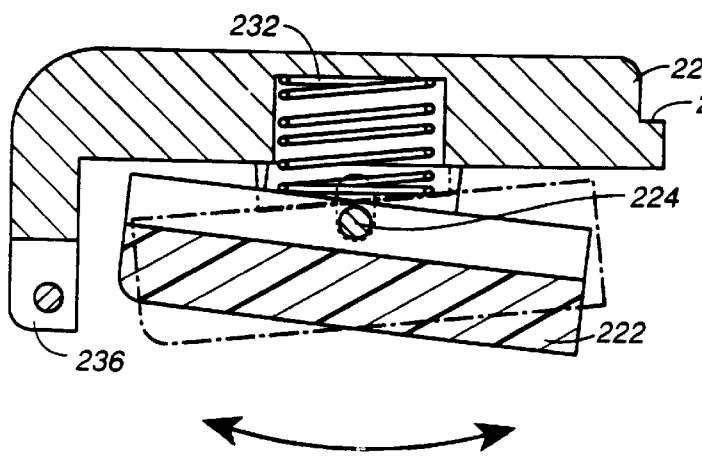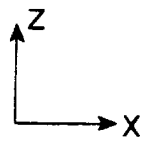
FIG._16D

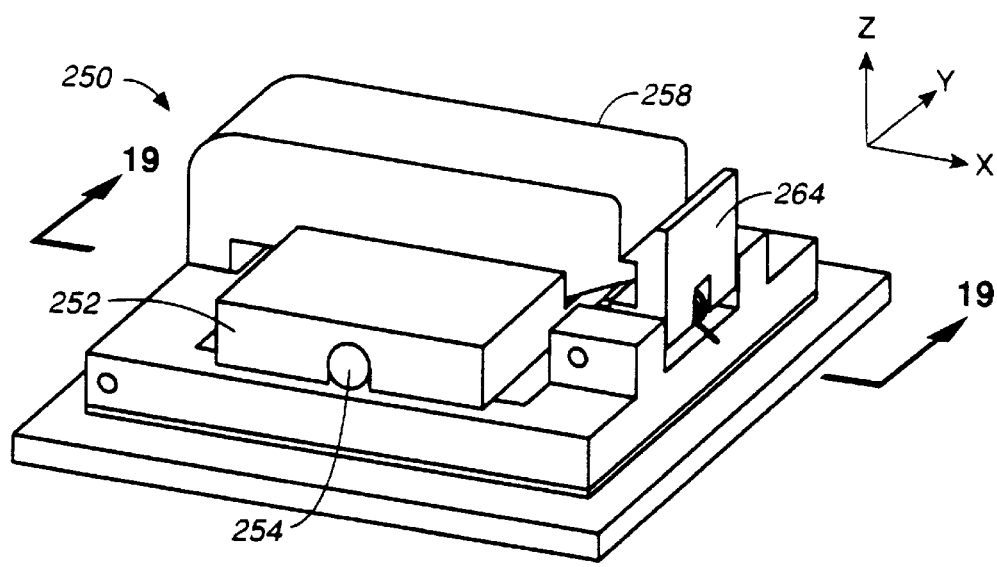
FIG._17
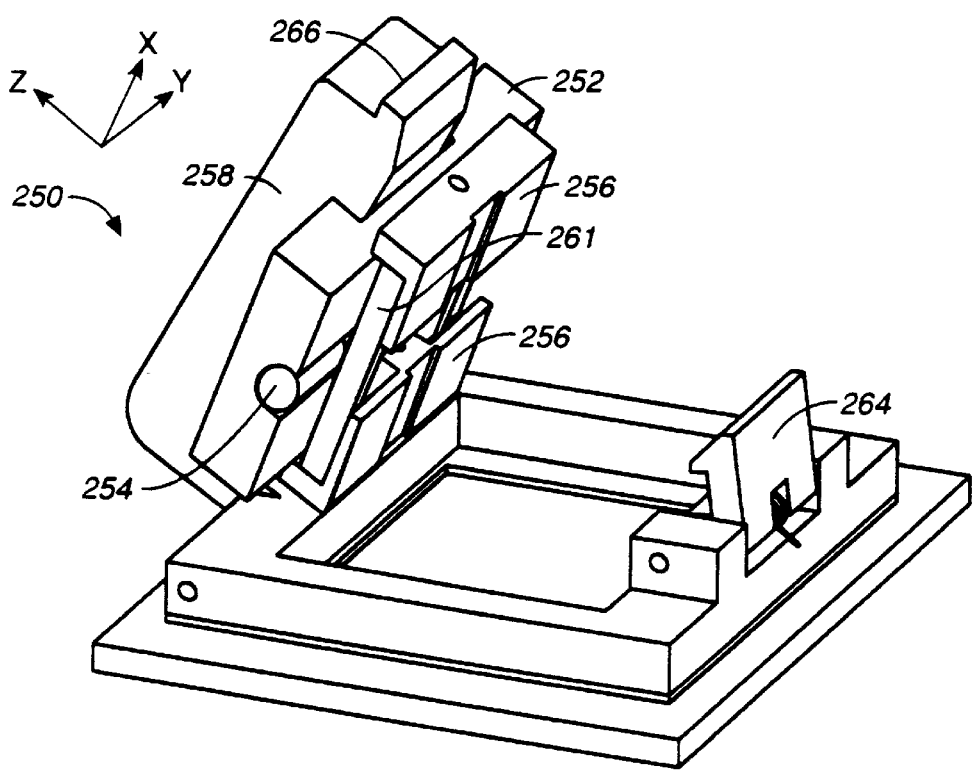
FIG._18

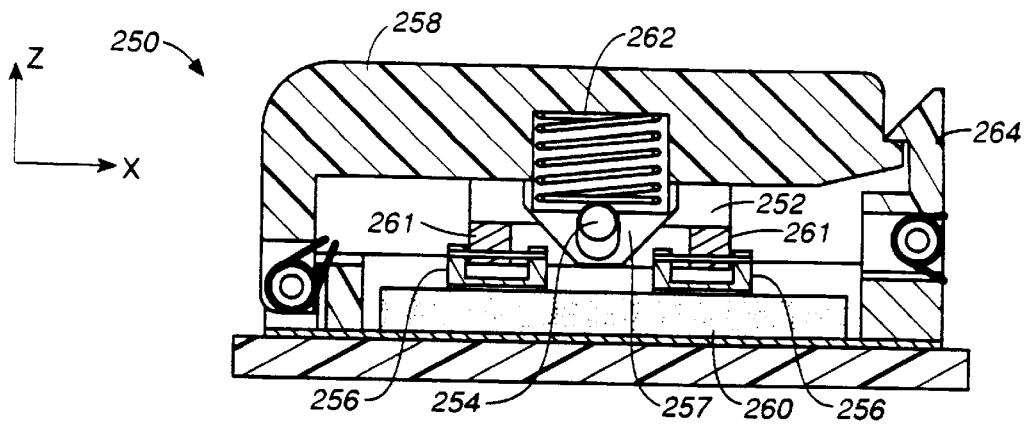
FIG._19
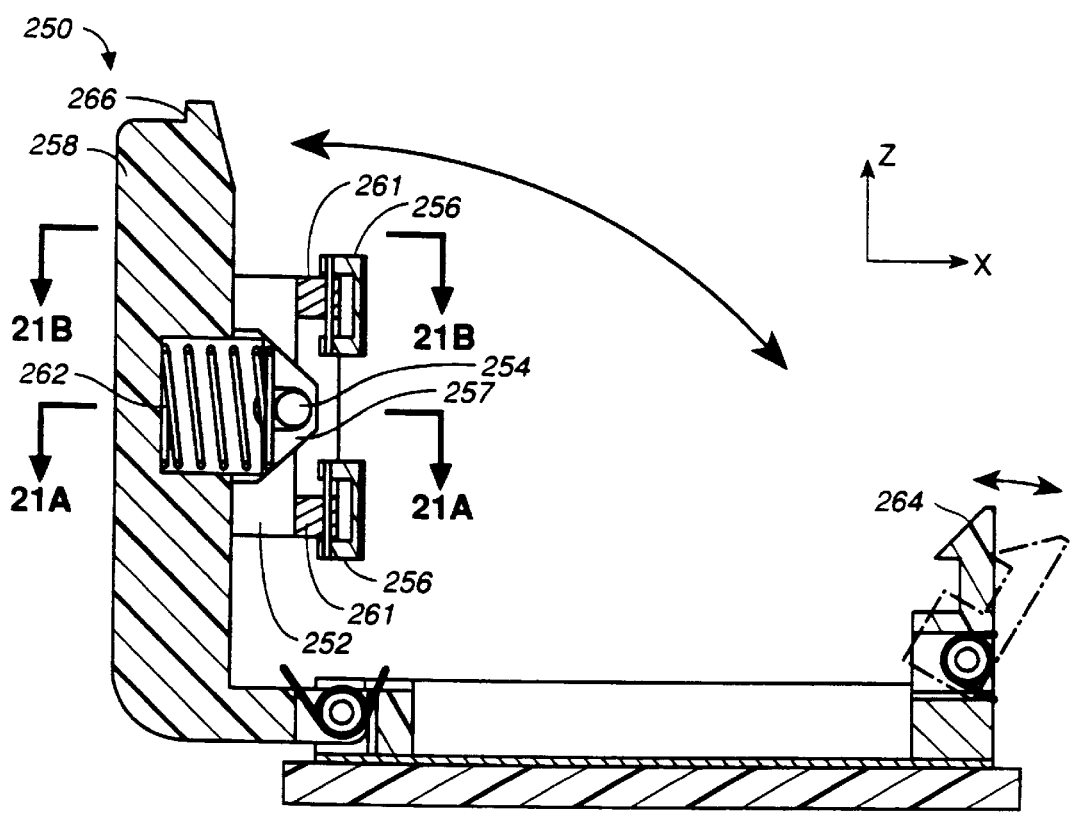
FIG._20

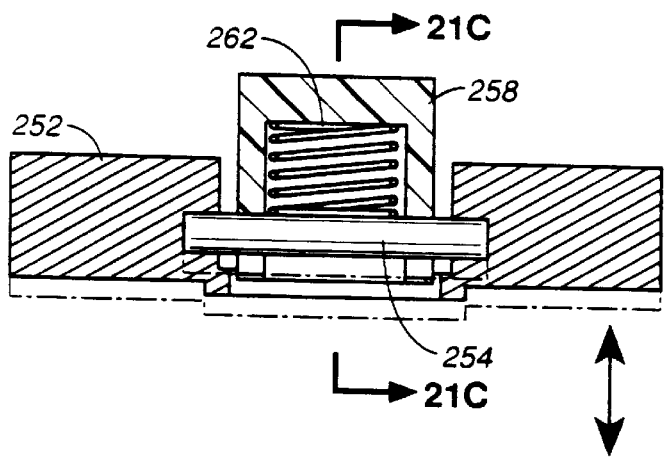
FIG._21A
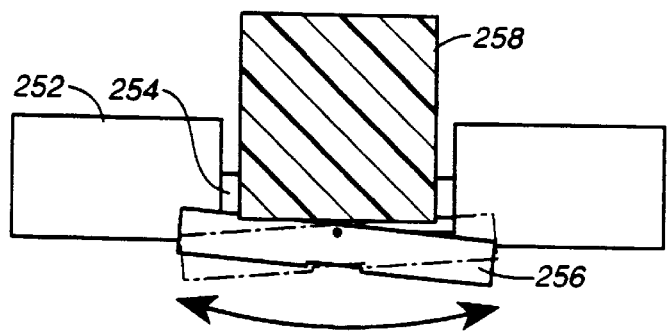
FIG._21B
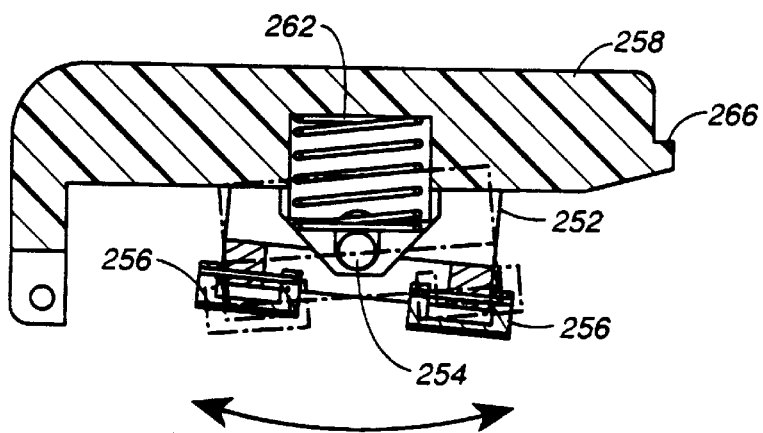
FIG._21C

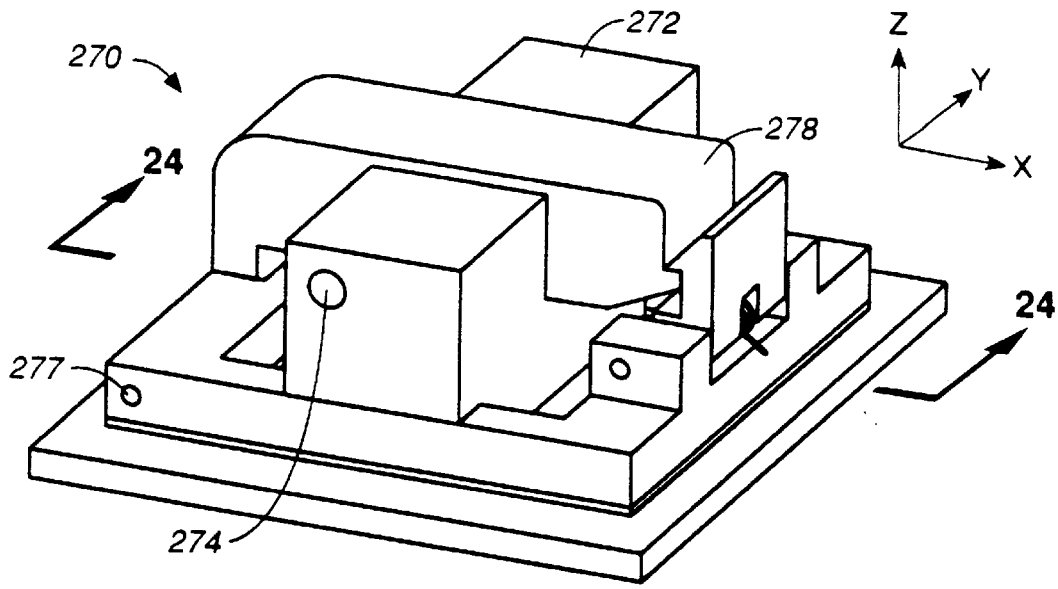
FIG._22
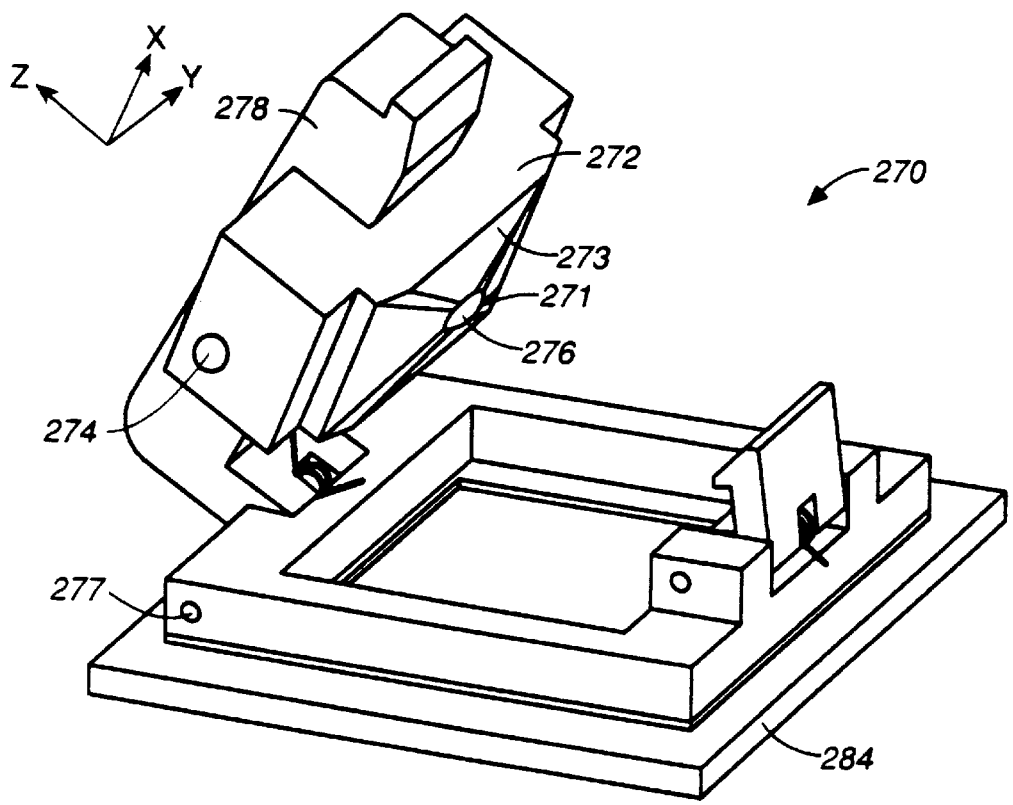
FIG._23

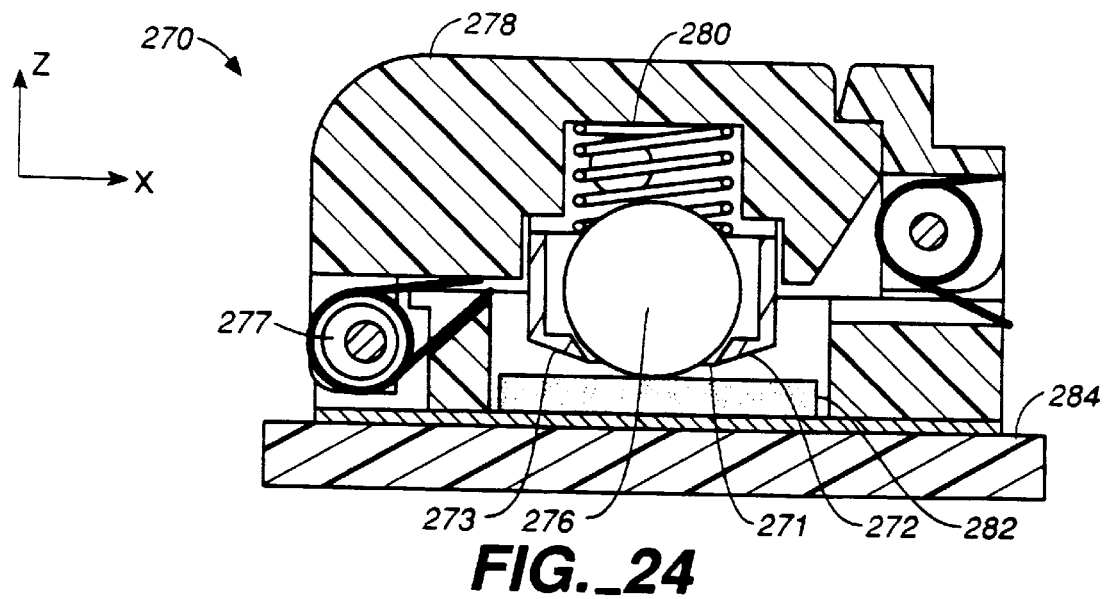
FIG._24
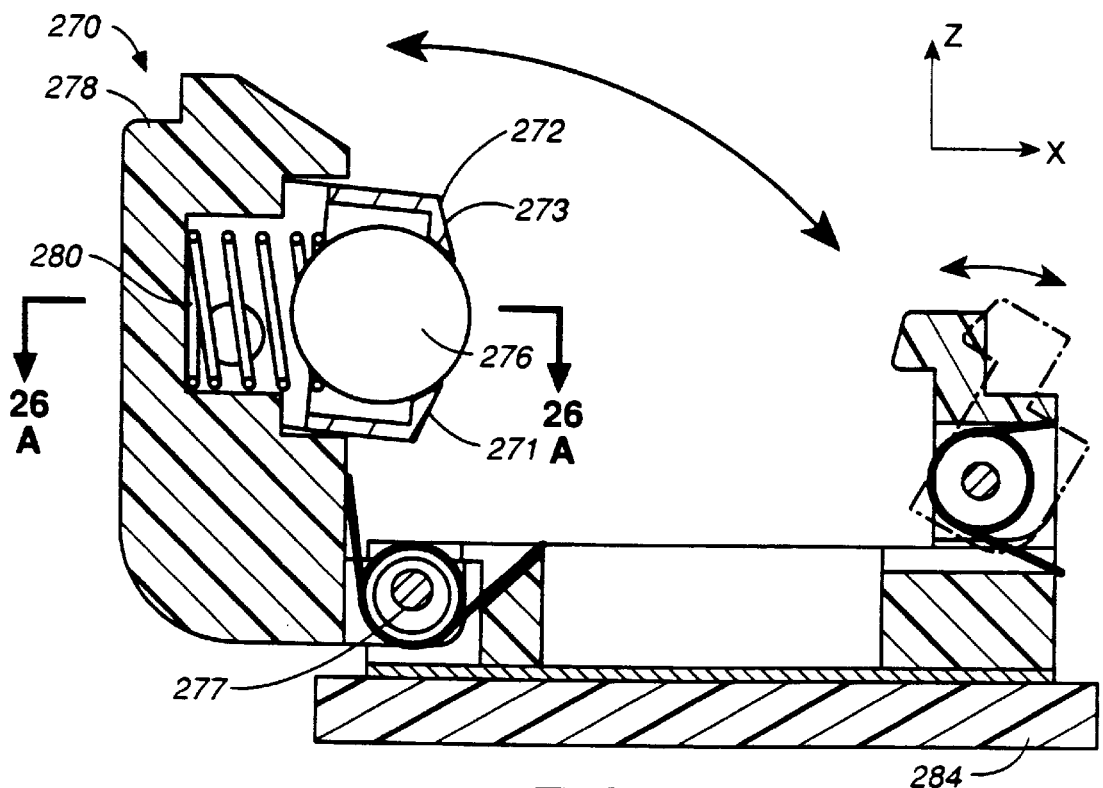
FIG._25

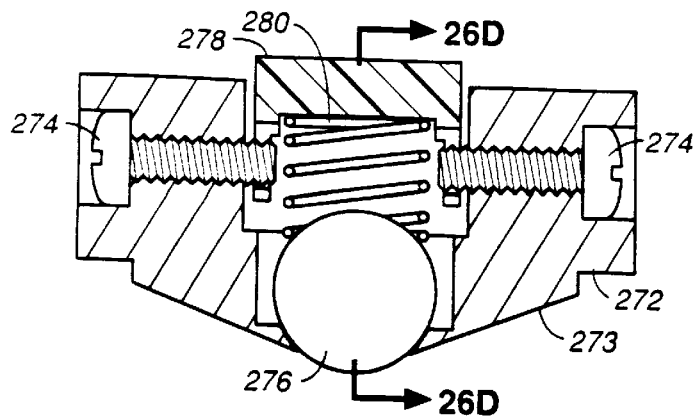
FIG._26A
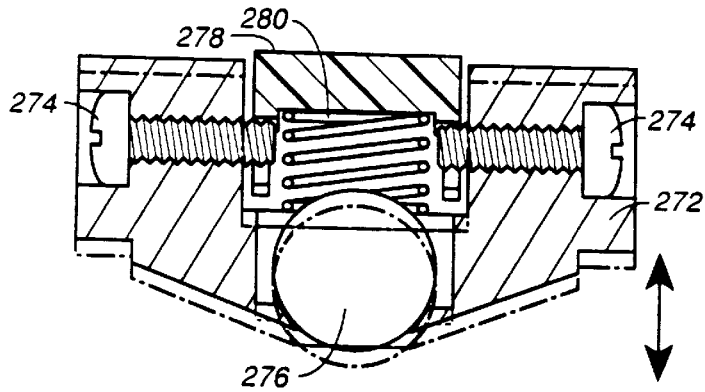
FIG._26B
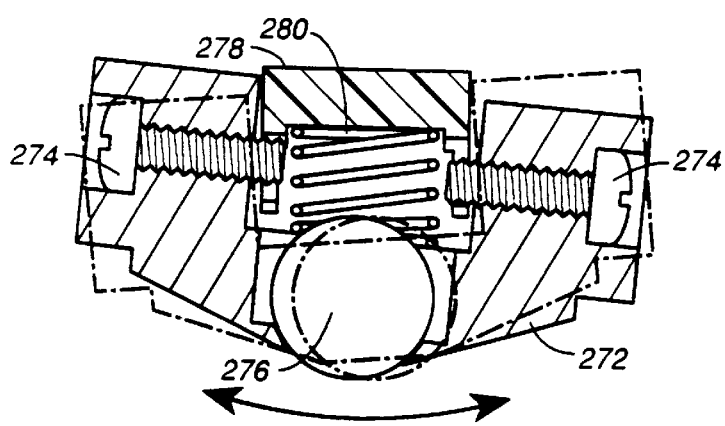
FIG._26C
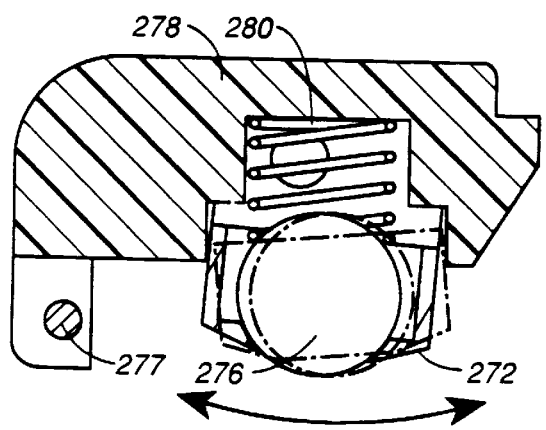
FIG._26D

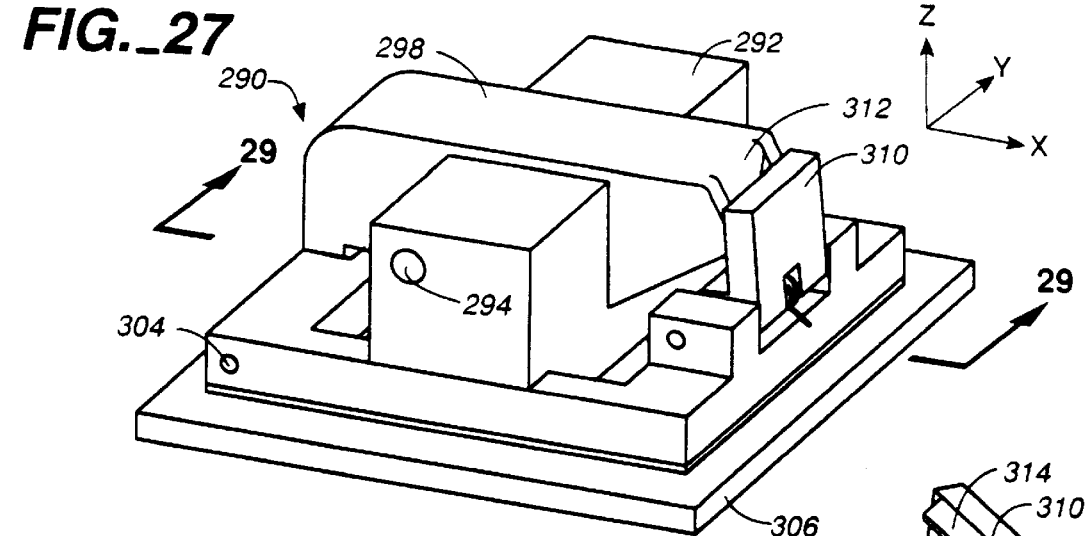
FIG._27
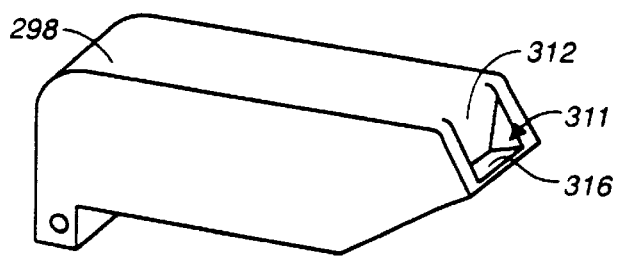
FIG._27A
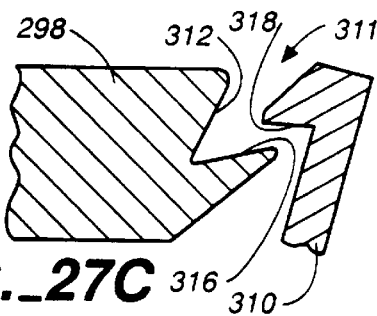
FIG._27B
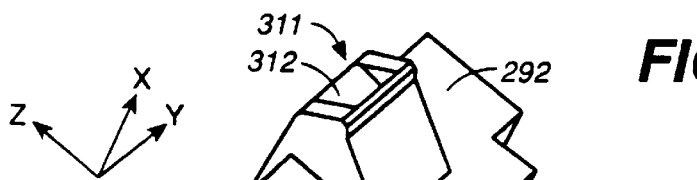
FIG._27C
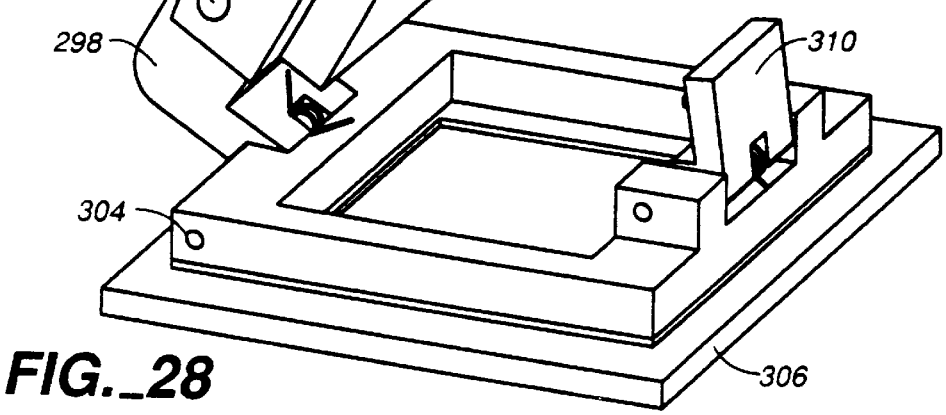
FIG._28

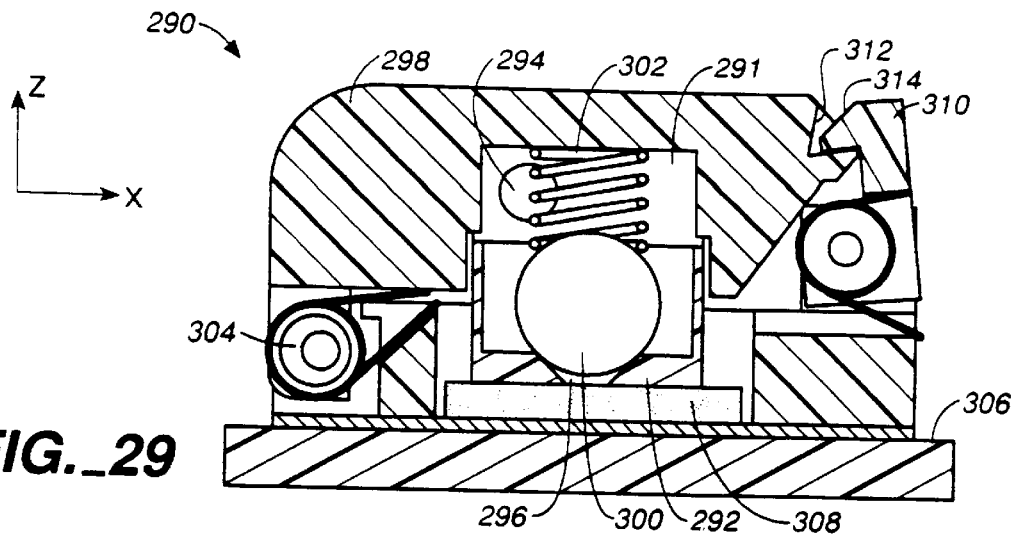
FIG._29
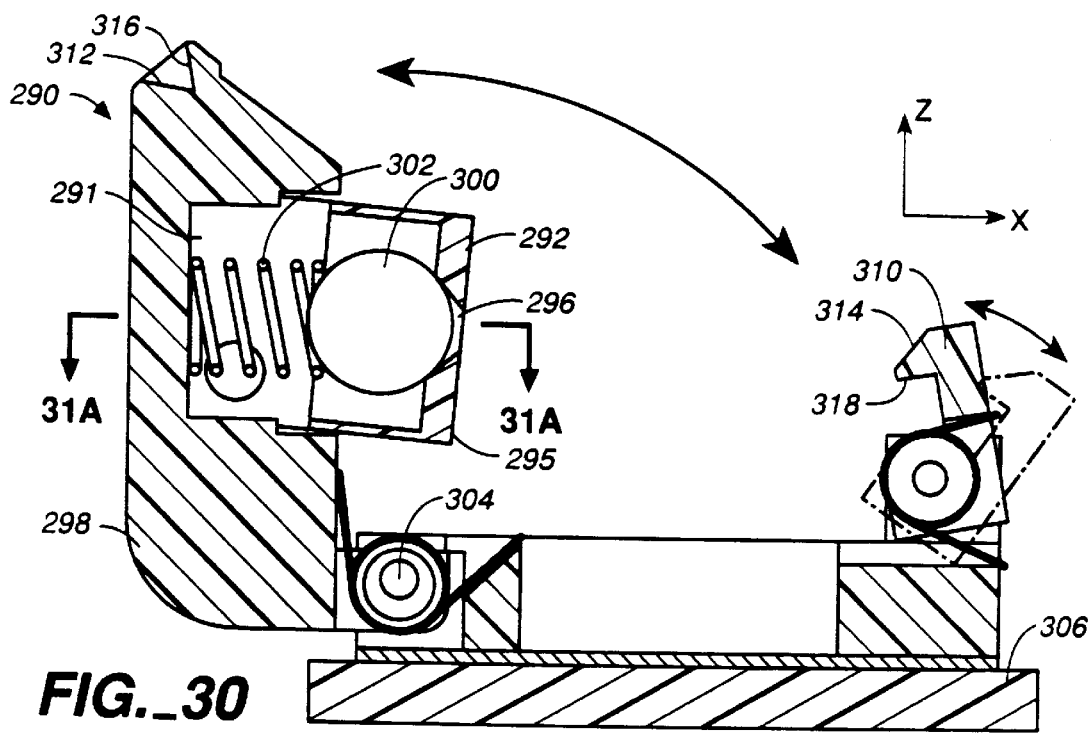
FIG._30
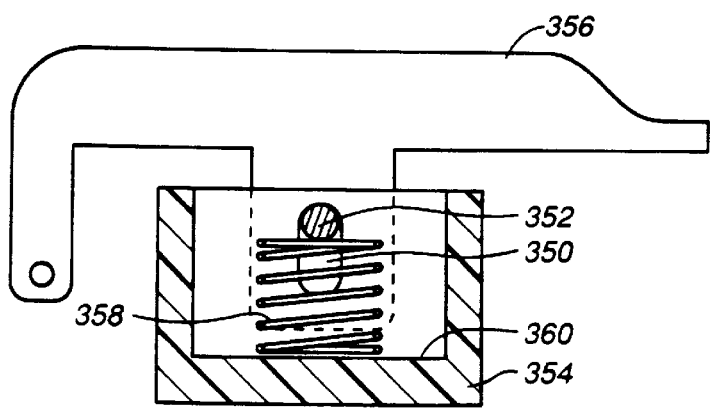
FIG._34

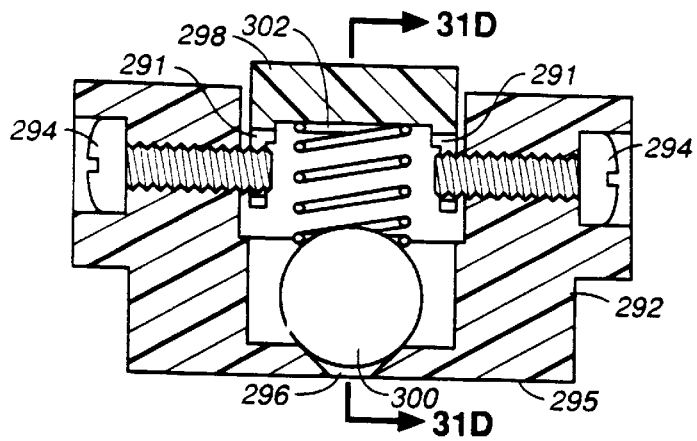
FIG._31A
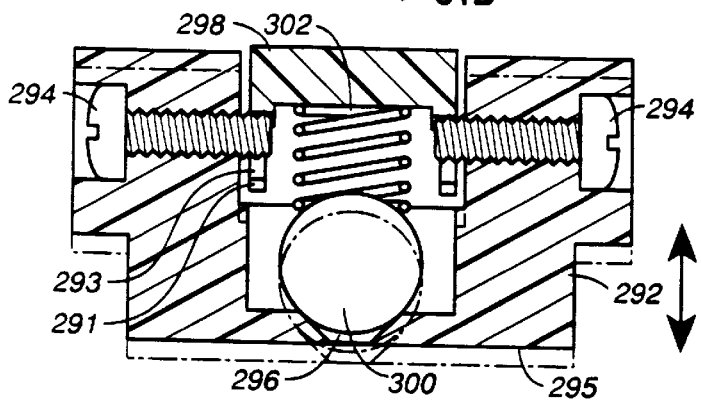
FIG._31B
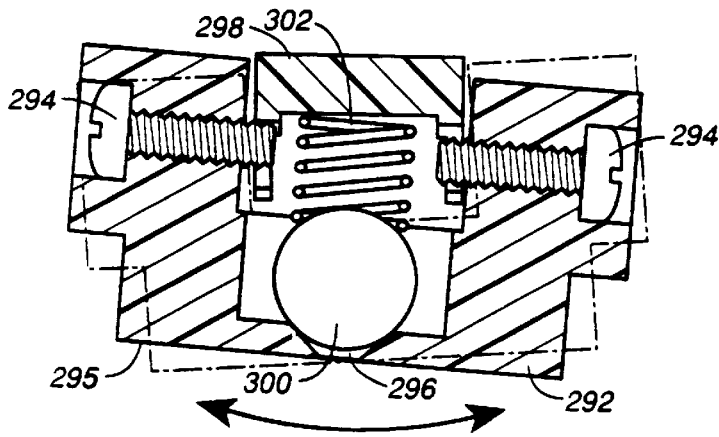
FIG. 31C
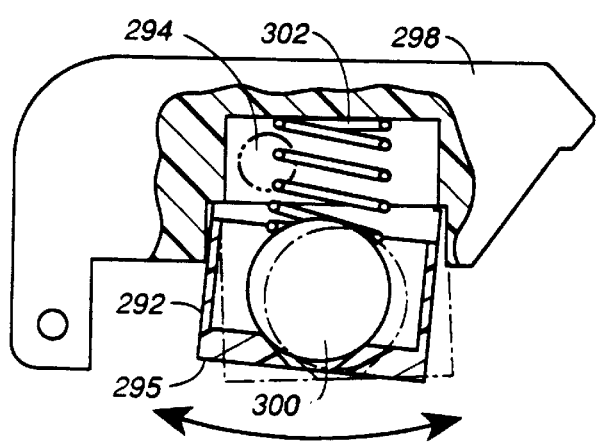
FIG._31D

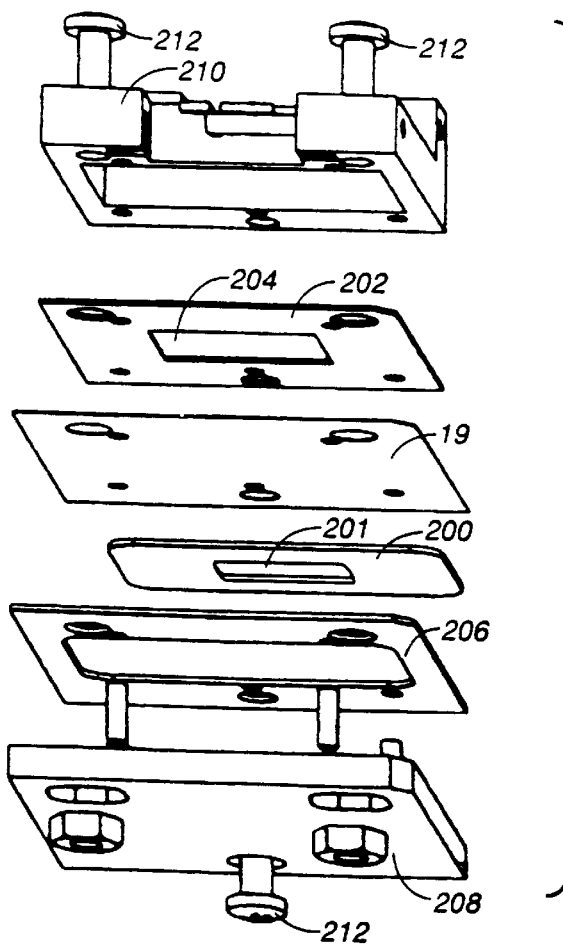
FIG._32
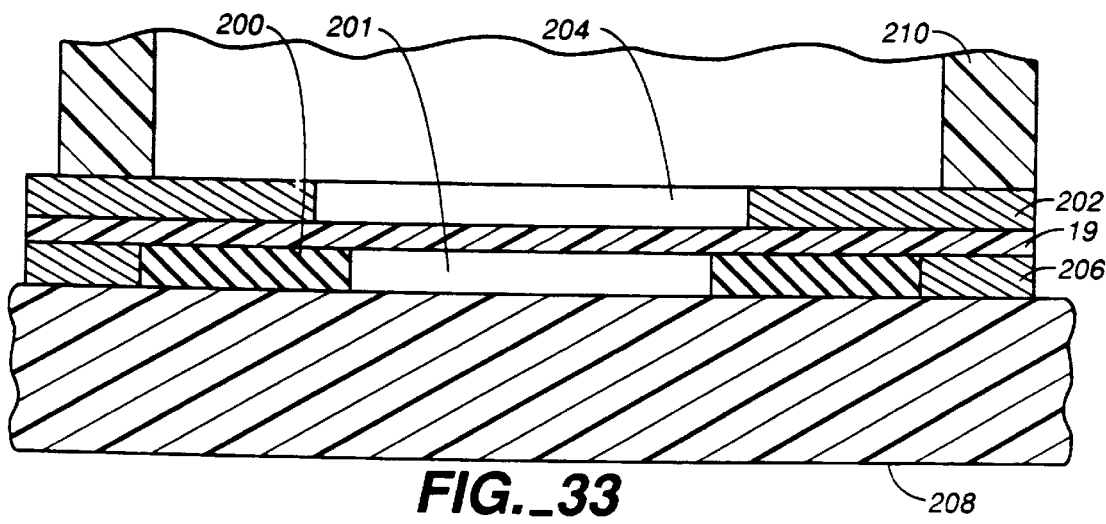
FIG._33

REUSABLE DIE CARRIER FOR BURN-IN AND BURN-IN PROCESS

CROSS-REFERENCE TO RELATED APPLICATIONS

This application is a continuation-in-part of U.S. patent application Ser. No. 08/645,343, filed May 13, 1996, now abandoned, which is a continuation-in-part of application Ser. No. 08/089,752, Filed Jul. 9, 1993, now U.S. Pat. No. 5,517,125, issued May 14, 1996, the disclosures of which are hereby incorporated by reference.

This invention was supported in part by grants from Advanced Research Projects Agency (grant number MDA 972-94-2-001). The U.S. Government may have rights in this invention.

BACKGROUND OF THE INVENTION

1. Field of the Invention

The present invention relates generally to a fixture and process for use during evaluation of integrated circuits and other semiconductor devices. More particularly, it relates to a reusable carrier for temporarily holding a semiconductor device as an unpackaged die or as a chip-scale package while the semiconductor device is tested and/or burned in and to a burn-in and/or electrical test process using a reusable carrier.

2. Description of the Prior Art:

When fabrication of integrated circuits and other semiconductor devices, such as memory devices and discrete power transistors, has been completed, the semiconductor devices are subjected to burn-in and electrical test in order to identify and eliminate defective semiconductor devices before shipment to a customer. The term "burn-in" relates to a procedure in which the semiconductor devices are exercised at a controlled temperature, typically an elevated temperature in an oven, and certain operating electrical bias and/or signals are supplied to the semiconductor devices while they are at the elevated temperature. The use of the elevated temperature accelerates stress to which the devices are subjected during burn-in, so that marginal devices that would otherwise fail shortly after being placed in service fail during burn-in and are eliminated before shipping. In electrical test, a more complete set of operating bias and signals is supplied to the device to provide a thorough evaluation of its functions.

As presently practiced, both burn-in and complete electrical test are not carried out until the semiconductor devices have been assembled in packages as they will be inserted in circuit boards. For burn-in, the packaged devices are temporarily inserted in sockets of special burn-in boards which include circuit traces for contacting a sufficient number of contact pins or pads on the packages to provide the operating electrical bias and/or signals used during burn-in. In some burn-in applications, contact needs to be made only to a limited number of pins or pads of a packaged integrated circuit. For electrical test to verify performance, the integrated circuit is removed from the burn-in board and placed in a test fixture that will allow electrical contact to all of the pins or pads of the packaged integrated circuit.

When a packaged integrated circuit is found to be defective during burn-in or electrical test, it must be scrapped. In addition to the defective die, the integrated circuit package itself must be discarded. For many years, it has therefore been desired to carry out the testing and burn-in of integrated circuits at the die level, before being packaged. Also, the advent of multi-chip modules (MCMs) has led to a new requirement for actually shipping devices in die form for assembly of several die into an MCM. The die must be tested and burned in before assembly into the MCM, since MCMs are difficult and expensive to repair. While many proposals to do this have been made, they have not achieved general use. A significant factor preventing burn-in and/or electrical test at the die level has been the lack of a fixture for carrying and protecting the die during burn-in and/or electrical test that will meet the stringent requirements for such a carrier.

Additionally, the die may be packaged using chip-scale packaging, in which the package is only slightly larger than the die. In this case, the contacts are still very small, and the package follows the outline of the die, so standard sockets are not available for a device this small. Therefore, there is a need for a carrier for burning-in and testing chip-scale packaged dies.

SUMMARY OF THE INVENTION

Accordingly, it is an object of this invention to provide a novel reusable carrier for temporarily holding a semiconductor die, which may be in a chip-scale package.

It is another object of the invention to provide such a reusable carrier for temporarily holding a semiconductor die for burn-in that is also suitable for use in electrical test of the semiconductor die.

It is still another object of the invention to provide a process using a reusable carrier for burn-in evaluation of a semiconductor die.

It is yet another object of the invention to provide such a process in which the reusable carrier is further used for electrical test of the semiconductor die.

It is a further object of the invention to provide such a reusable carrier for temporarily holding a semiconductor die that can be used with conventional burn-in systems and burn-in boards in the process.

It is still another object of the invention to provide such a reusable carrier for temporarily holding a semiconductor die that can readily be provided in different sizes for different size die and different numbers of pins.

It is yet another object of the invention to provide such a reusable carrier for temporarily holding a semiconductor die in which the semiconductor die can be environmentally protected.

The attainment of these and related objects may be achieved through use of the novel reusable die carrier and burn-in and/or electrical test process herein disclosed. A reusable die carrier in accordance with this invention has a base having a plurality of carrier contacts for electrical connection of the semiconductor die external of the reusable carrier. A plurality of electrically conductive traces on the base have first ends connected to the peripheral contacts and have second ends positioned to engage die contacts on the semiconductor die. A means on the base may be used to position the semiconductor die with the die contacts engaging the second ends of the plurality of electrically conductive traces. A lid is configured for removable positioning over the base to cover the semiconductor die, and may also act as a heat sink. A force delivery system is provided for applying force to the semiconductor die when the die is placed in the carrier. The force delivery system may further be configured to uniformly distribute force over the surface of the die. A means secures the lid in position over the base.

A process in accordance with the invention for burn-in and/or electrical test of an unpackaged semiconductor die includes providing a reusable carrier for the semiconductor die having a plurality of contacts on the carrier. The semiconductor die is inserted in the reusable carrier. The semiconductor die is heated to an elevated temperature. Burn-in input electrical bias and, optionally signals, are supplied from a source external of the reusable carrier to at least some of the contacts and through the reusable carrier to the semiconductor die. Burn-in output electrical signals in response to the burn-in input electrical signals, if supplied, are received from the semiconductor die and through the reusable carrier from at least some of the plurality of contacts. The burn-in output electrical signals may be used to evaluate the semiconductor die. For example, the semiconductor die may be categorized as good or defective based on the signals. Electrical testing may be performed in a similar manner, by applying electrical test input signals and receiving electrical test output signals, which may be used to evaluate the semiconductor die.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIG. 1 is an exploded perspective view of a reusable carrier in accordance with the invention for temporarily holding a semiconductor die.

FIG. 2 is a cross section view of the reusable carrier for temporarily holding a semiconductor die of FIG. 1 in assembled form, ready for use.

FIG. 3 is a plan view of the reusable carrier for temporarily holding a semiconductor die of FIGS. 1–2.

FIG. 4 is a cross section view of the reusable carrier for temporarily holding a semiconductor die similar to FIG. 2, but with the carrier in an open position.

FIG. 5 is a cross section view similar to FIG. 2, but of a second embodiment of a reusable carrier in accordance with the invention for temporarily holding a semiconductor die.

FIG. 6 is a plan view similar to FIG. 3, but of the FIG. 5 embodiment of the reusable carrier for temporarily holding a semiconductor die.

FIG. 6A is a plan view of a substrate portion of the reusable carrier in FIG. 5 for temporarily contacting a semiconductor die.

FIG. 6B is a cross section view of area 6B in FIG. 6A.

FIG. 7 is a plan view of a third embodiment of a reusable die carrier in accordance with the invention for temporarily holding a semiconductor die.

FIG. 8 is a plan view of the reusable carrier of FIG. 7 in use with a test fixture.

FIG. 9 is a cross section view, taken along the line 9—9 of FIG. 8.

FIG. 10 is a plan view of a portion of another embodiment of a reusable carrier in accordance with the invention.

FIG. 11 is a side view of the die carrier portion shown in FIG. 10.

FIG. 12 is a perspective view of a reusable carrier having a two piece balance pressure system.

FIG. 13 is a perspective view of the reusable carrier of FIG. 12 in the open condition.

FIG. 14 is a cross section view of the reusable carrier of FIG. 12 in the closed condition, taken along line 14—14 in FIG. 12 with a die in place.

FIG. 15 is a cross section view of the reusable carrier of FIG. 12 in the open condition.

FIG. 16A is a cross section view of the top portion of the reusable carrier of FIG. 12, taken along line 16A—16A in FIG. 15.

FIG. 16B is a cross section view of the top portion of the reusable carrier of FIG. 12, taken along line 16A—16A in FIG. 15, illustrating the z-axis articulation of the balance block.

FIG. 16C is a cross section view of the top portion of the reusable carrier of FIG. 12, taken along line 16A—16A in FIG. 15, illustrating the articulation of the balance block about the x-axis.

FIG. 16D is a cross section view of the top portion of the reusable carrier of FIG. 12, taken along 16D—16D in FIG. 16A, illustrating the articulation of the balance block about the y-axis.

FIG. 17 is a perspective view of the reusable carrier having a four piece balance pressure system.

FIG. 18 is a perspective view of the reusable carrier of FIG. 17 in the open condition.

FIG. 19 is a cross section view of the reusable carrier of FIG. 17 in the closed condition, taken along line 19—19 in FIG. 17 with a die in place.

FIG. 20 is a cross section view of the reusable carrier of FIG. 17 in the open condition.

FIG. 21A is a cross section view of the top portion of the reusable carrier of FIG. 17, taken along line 21A—21A in FIG. 20, illustrating the z-axis articulation of the balance block.

FIG. 21B is a cross section view of the top portion of the reusable carrier of FIG. 17, taken along line 21B—21B in FIG. 20, illustrating the articulation of the balance block about the x-axis.

FIG. 21C is a cross section view of the top portion of the reusable carrier of FIG. 17, taken along line 21C—21C in FIG. 21A, illustrating the articulation of the balance block about the y-axis.

FIG. 22 is a perspective view of reusable carrier having a ball bearing point contact pressure system.

FIG. 23 is a perspective view of the reusable carrier of FIG. 22 in the open condition.

FIG. 24 is a cross section view of the reusable carrier of FIG. 22 in the closed condition.

FIG. 25 is a cross section view of the reusable carrier of FIG. 22 in the open condition.

FIG. 26A is a cross section view of the top portion of the reusable carrier of FIG. 22, taken along line 26A—26A in FIG. 25.

FIG. 26B is a cross section view of the top portion of the reusable carrier of FIG. 22, taken along line 26A—26A in FIG. 25, illustrating the z-axis articulation of the balance block.

FIG. 26C is a cross section view of the top portion of the reusable carrier of FIG. 22, taken along line 26A—26A in FIG. 25, illustrating the articulation of the balance block about the x-axis.

FIG. 26D is a cross section view of the top portion of the reusable carrier of FIG. 22, taken along line 26D—26D in FIG. 26, illustrating the articulation of the balance block about the y-axis.

FIG. 27 is a perspective view of the lid of the reusable carrier having a ball bearing loaded pressure plate.

FIG. 27A is a perspective view of the lid of the reusable carrier of FIG. 27, showing the latch surface for use in an improved latch mechanism.

FIG. 27B is a perspective view of the latch of the reusable carrier of FIG. 27.

FIG. 27C is an enlarged cross section of the improved latch mechanism.

FIG. 28 is a perspective view of the reusable carrier of FIG. 27 in the open condition.

FIG. 29 is a cross section view of the reusable carrier of FIG. 27 in the closed condition, taken along line 29—29 in FIG. 27 with a die in place.

FIG. 30 is a cross section view of the reusable carrier of FIG. 27 in the open condition.

FIG. 31A is a cross section view of the top portion of the reusable carrier of FIG. 27, taken along line 31—31 in FIG. 30.

FIG. 31B is a cross section view of the top portion of the reusable carrier of FIG. 27, taken along line 31—31 in FIG. 30, illustrating the z-axis articulation of the balance block.

FIG. 31C is a cross section view of the top portion of the reusable carrier of FIG. 27, taken along line 31—31 in FIG. 30, illustrating the articulation of the balance block about the x-axis.

FIG. 31D is a cross section view of the top portion of the reusable carrier of FIG. 27, illustrating the articulation of the balance block about the y-axis.

FIG. 32 is an exploded perspective view from below of the base assembly of a reusable die carrier.

FIG. 33 is a cross section view of the assembled base assembly of FIG. 32.

FIG. 34 is a cross section view of a portion of another embodiment of a reusable carrier in accordance with the invention.

DETAILED DESCRIPTION OF THE INVENTION

Turning now to the drawings, more particularly to FIGS. 1–4, there is shown a reusable carrier 10 for temporarily holding an integrated circuit 12 during burn-in and/or electrical test. The reusable carrier 10 includes a base 14 and a lid 16 attached to the base 14 by hinges 18. A flexible substrate 19, formed from a suitable polymeric material, e.g. polyimide, is attached to the base 14 with a suitable adhesive or fastener. The substrate 19 may also be formed from a hard, inflexible material such as ceramic or silicon, for use with certain types of integrated circuits, such as C4 or other flip chips intended for flip-chip bonding. Four alignment posts 20 have tapered surfaces 22 that engage corners 24 of the integrated circuit 12 to position the integrated circuit 12 precisely on upper surface 26 of the substrate 19. A spring-loaded latch engages projection 30 in aperture 32 of the base 14 to hold the lid 16 closed over the integrated circuit 12. As a supplement to or as a replacement for the aligning posts that function to align the integrated circuit 12, a visual alignment system (not shown) including a window for observing positioning of the integrated circuit 12 on the substrate 19 could be provided.

Electrically conductive traces 34 on the surface 26 may have contact bumps (not shown) which engage integrated circuit contact pads (not shown) or C4 or other conductive bumps (not shown) on the integrated circuit 12 to connect the integrated circuit 12 to peripheral contact pads 38 around edges 40 of the substrate 19. The bumps could alternatively be provided on the integrated circuit 12, rather than on the traces 34. A spring 42 engages upper surface 43 of the integrated circuit 12 (which comprises the back side of the integrated circuit 12) when the lid 16 is in its closed position over the integrated circuit 12, to provide a biasing force to urge the contact pads against the conductive traces 34 with sufficient force to insure a reliable electrical connection.

A thin layer of rubber or other suitable compliant material may be provided between the flexible substrate 19 and the base 14 to compensate for height differences in the bumps, die and base. If the integrated circuit 12 is provided with solder bumps (not shown), the compliant material may be left out to take advantage of the compliance of the softer solder bumps. This may improve the solder bumps' deformation and coplanarity after burn-in and testing.

As FIGS. 32 and 33 indicate, the compliant material 200 may also be tailored so that it is present under the flexible substrate 19 only in the area of the contact bumps (not shown), with no material under the area 201 where the center of the integrated circuit 12 (see also FIG. 1) would be when the integrated circuit 12 is positioned in the carrier. This results in concentration of force on the integrated circuit 12 in the area of the contact bumps, and thus, less total force is necessary to urge the integrated circuit contact pads into sufficient contact with the contact bumps. It may also be desirable to focus compliance further by replacing the compliant material 200 with individual compliant pieces (e.g. individual blobs of silicone rubber) below each contact bump. This would further focus the force in the area of the contact bumps, and reduce the force that must be applied to the integrated circuit 12 to assure sufficient contact with the contact bumps, as well as avoid pushing onto other areas of the die.

Also shown in FIGS. 32 and 33 is an upper plate 202 having a void 204 in which the integrated circuit 12 is received. This upper plate 202 is made from a suitable material such as Alloy 42 (obtainable from Computer Technology Corporation), and is placed above the substrate 19. When the integrated circuit 12 is received in the carrier, the upper plate 202 mechanically aligns the integrated circuit contact pads with the contact bumps on the substrate 19. The upper plate 202 also flattens the substrate 19, if a flexible substrate is used. The upper plate 202 is used to align the integrated circuit 12 and replaces the alignment posts in the FIGS. 1–4 embodiment.

The material for the upper plate, Alloy 42 in this case, is chosen with thermal coefficient of expansion (TCE) in mind. Because the carrier and die are being heated, the TCE of the carrier must be fairly closely matched to that of the die. Otherwise, the contacts and contact bumps will become misaligned with respect to each other during burn-in, and may lose electrical connection with each other. The TCE of polyimide, which was used for the flexible substrate 19, is significantly different from that of silicon. On the other hand, the TCE of Alloy 42 is much closer to that of silicon. It is desirable to sandwich the flexible substrate 19 between two Alloy 42 plates or bases or bond the flexible substrate to the Alloy 42 base or alignment plate with a suitable adhesive, so that the movement of the flexible substrate 19 due to thermal expansion is constrained to more closely match that of the semiconductor die.

Thus, another Alloy 42 plate is used as a base plate 206 in conjunction with the upper plate 202 to sandwich the flexible substrate 19. This eliminates the need for the base 208 to be made from Alloy 42. The base 208 may thus be made from a less expensive material such as plastic.

Similarly, the use of the Alloy 42 upper plate 202 eliminates the need for the upper base or hinge block 210 to be made from Alloy 42. Further the Alloy 42 sandwich is more robust.

The upper base or hinge block 210 and the base 208, which as described above may comprise a suitable material such as metal (Alloy 42) or plastic, are secured together by screws 212.

Referring to FIGS. 2, 4, and 5, a vacuum port 46 is provided through the base 14, substrate 19 and compliant material to permit application of a vacuum to hold the integrated circuit 12 in place on the substrate 19. In practice, the substrate 19 is desirably a commercially available substrate, available from several manufacturers using different technologies. For example, the substrate could be an ASMAT substrate, obtainable from Nitto Denko.

The reusable carrier 10 is reasonably environmentally protected, so that the unpackaged integrated circuit 12 no longer needs to be handled in a clean room environment. The reusable carrier 10 can now be used in standard burn-in or test systems.

For burn-in, the temporary package 10 containing the integrated circuit die 12 is now loaded into a socket 48 on a burn-in board 50, which is then loaded into a burn-in system, where otherwise standard burn-in is performed. The pads 38 of the substrate 19, now part of the temporary package 10, contact the leads 52 of the burn-in socket 48. As is conventional, burn-in may be carried out with the application of no more than an operating potential to the integrated circuit, with the application of both operating potential and operating signals supplied to exercise the integrated circuit 12, or with the application of both operating potential and operating signals and the sensing of output signals from the integrated circuit 12 during burn-in.

FIGS. 5–6B show another reusable carrier 60 for use with a memory integrated circuit 62. Tapered alignment posts 64 are positioned to receive the different shaped integrated circuit 62 in a precise position so that its contact pads will engage contact bumps on substrate 70. As in the FIGS. 1–4 embodiment, electrically conductive copper traces 72 on flexible polyimide substrate 70 have contact bumps 74 which engage contact pads on the integrated circuit 62 to connect the integrated circuit 62 to peripheral contact pads 68 around edges 77 of the substrate 70. Other than as shown and described, the construction and operation of the FIGS. 5–6B embodiment of the invention is the same as that of the FIGS. 1–4 embodiment.

FIG. 7 shows a reusable carrier 80 having additional contact pads 82 on substrate 84 for testing. For test, which often requires more contacts than burn-in, the reusable carrier 80 is loaded into a probe card 86 (FIGS. 8–9) in a tester (not shown). The probe card 86 has a plurality of conductive traces 88 on an epoxy or polyimide board 89, each connected to a probe tip 90 for contacting the additional pads 82 for testing and to a tester connection 92. For clarity, only twelve traces 88 are shown. In practice, an actual probe card might contain hundreds of conductive traces 88 and probe tips 90. Additional pads 82 are connected to an integrated circuit under test by conductive traces 93 on substrate 84 and are used for the additional contacts needed for test. This construction of the substrate 84 allows the socket 48 (FIG. 1) used for burn-in to have significantly fewer pins than would otherwise be needed for test, saving cost in burn-in, since typically thousands of times more burn-in sockets than probe cards are required. The electrical test is carried out either prior to or after burn-in.

FIGS. 10 and 11 show part of a die carrier 100, in which a combination of fixed posts 102 and springs 104 provide an alignment mechanism for the die carrier. The posts 102 and springs 104 are attached to base 106 and extend through flexible substrate 108. The fixed posts 102 fix the location of two adjacent sides 110 and 112 of die 114, assuring that the die is properly positioned on the substrate 108. A taper 116 at the base of the posts 102 holds down the two adjacent sides 110 and 112 when the die 114 is pressed against the posts 102. The pressure to hold the die 114 against the posts 102 is supplied by the two springs 104, which are shaped also to supply a slight downward pressure on the two edges 118 of the die in contact with the springs 104. This downward pressure on the die 114 holds it in place as a die positioning mechanism (not shown) releases it and pulls away from the die 114, overcoming any electrostatic or molecular attraction between the die and the positioning mechanism. This pressure serves the same function of holding the die 114 in place when the carrier lid (not shown) is opened after the burn-in or test. Other than as shown and described, the construction and operation of the FIGS. 10–11 embodiment of the invention is the same as that of the FIGS. 1–6B embodiments.

The spring 42 in FIG. 4, which engages the upper surface 43 of the integrated circuit 12 to provide biasing force, may be replaced by an alternative force delivery mechanism to apply force to the surface 43 in a symmetric or uniform manner. Such a force delivery system may be in the form of an area contact pressure system, several embodiments of which will be described below.

Illustrated in FIGS. 12–16D is a reusable die carrier 220 having a two piece balance pressure system which distributes force uniformly along the z- and x-axes. As shown, the two piece balance pressure system comprises a balance block 222 and a rotating pin 224 on which the balance block 222 is mounted. The rotating pin 224 is pivotally mounted along the y-axis in flanges 226 extending from the sides of the lid 228, and is also movable in a direction (the z-axis direction in FIG. 12) orthogonal to the major plane of the lid 228. The balance block 222, which acts as a pressure plate for applying force directly to the semiconductor die 230, is thus able to pivot about the y-axis to evenly distribute force along the x-axis. A compression spring 232 controls the movement of the rotating pin 224 and balance block 222 along the axis orthogonal to the major plane of the lid 228. This spring 232 supplies biasing force to the balance block 222 via the rotating pin 224, and thence to the semiconductor die 230. A separate pressure plate for contacting the semiconductor die 230 may be affixed to the underside of the balance block 222, or the balance block 222 itself may be used as a pressure plate.

As shown in FIGS. 16A and 16B, the spring 232 compresses to allow the balance block 222 to move along the z-axis. The rotating pin 224 is able to slide in the holes 234 to accommodate the movement of the balance block 222. FIG. 16D shows the pivoting motion of the balance block 222 about the y-axis, whereby it distributes force uniformly along the x-axis. In FIG. 16C, the spring 232 also permits some movement due to deflection of the spring 232, allowing the balance block 222 to pivot about the x-axis.

In operation, a semiconductor die 230 is placed in the carrier 220. The lid 228 is moved from the open position, as illustrated in FIGS. 15 and 14. As the lid 228 is closed, the balance block 222 comes into contact with the semiconductor die 230. Because the balance block 222 is pivotally mounted for distribution of force along the x-axis, the force applied to the semiconductor die 230 by the balance block 222 is more uniformly distributed along the x-axis of the semiconductor die 230. This reduces the likelihood that excessive pressure will be applied to one end of the die 230, such as the end closest to the hinge of the lid 228. Such excessive localized pressure could directly cause damage to the semiconductor die 230. Excessive pressure could also cause the die 230 to "flip" (the end near the hinge 236 goes down, while the other goes up), which could result in improper positioning of the die 230 in the carrier 220, and damage when the lid 228 is brought closer to the fully closed position. The spring 232 also compresses, controlling the amount of force exerted on the balance block 222 and thus on the die 230, and provides compliance to more evenly distribute force. When the lid 228 is nearly closed, the corner of the lid 228 engages and exerts a sideways force on the latch 238 due to the angled surface 240 of the latch 238, causing the latch 238 to move away from the lid 228 to the position indicated in phantom outline. As the lid 228 closes, reaching a position substantially parallel to the base, the latch 238, which is spring-loaded by means of a torsion spring 242, moves back toward the lid 228. The latch 238 engages the corresponding latching surface 244 on the lid 228, and the lid 228 is secured.

The reusable die carrier 250 illustrated in FIGS. 17–21C has a four piece balance pressure system which uniformly distributes force along z-, x-, and y-axes. The four piece balance pressure system comprises a balance block 252, a rotating pin 254, and two pressure plates 256. The rotating pin 254 is pivotally mounted in flanges 257 extending from the lid 258, and is also movable in a direction (the z-axis direction in FIG. 17) orthogonal to the major plane of the lid 258. The balance block 252 is mounted on the rotating pin 254, and pivots around the axis of the rotating 254, which corresponds to the y-axis in FIG. 17. A compression spring 262 is placed between the lid 258 and the rotating pin 254 to control its movement and provide biasing force to the semiconductor die 260. Two pads 261 are attached to the underside of the balance block 252. Two pressure plates 256 are pivotally mounted in the two pads 261 for movement about an axis (corresponding to the x-axis in FIG. 17) transverse to the axis of the rotating pin 254. The pivoting motion of the balance block 252 about the y-axis allows it to distribute force along the x-axis, while the pivoting motions of the pressure plates 256 about the x-axis allow them to distribute force along the y-axis.

As shown in FIG. 21A, the spring 262 compresses to allow the rotating pin 254 and the balance block 252 to move along the z-axis. The rotating pin 254 is able to slide in the flanges 257 to accommodate the movement of the balance block 252. In FIG. 21B, the pressure plate 256 shown pivots about the x-axis to distribute force along the y-axis. FIG. 21C shows the pivoting motion of the balance block 252 about the yaxis, whereby it distributes force along the x-axis.

After a semiconductor die 260 is placed in the carrier 250, the lid 258 is moved from the open position to the closed position, as illustrated in FIGS. 20 and 19. The pressure plates 256 come into contact with the semiconductor die 260 as the lid 258 is closed. As stated above, the pressure plates 256 are able to pivot about the x-axis, and the balance block 252 which holds the pressure plates 256 is able to pivot about the y-axis. The articulation of the balance block 252 and pressure plates 256 thus causes force to be distributed uniformly along the y- and x-axes, reducing the possibility of flipping the die 260 or causing damage due to uneven force distribution. The spring 262 also compresses, controlling the amount of force exerted on the die 260, and provides compliance between the balance pressure system and the die 260. As the lid 258 reaches the closed position, the latch 264 engages the latching surface 266 on the lid 258 to secure the lid 258. This four piece system is particularly advantageous for use with large area dies and full array contacts to prevent die 260 flipping as described above.

FIGS. 22–26 illustrate a reusable die carrier 270 having a point contact pressure system, which is shown to comprise a pressure plate 272 having a hole 271 formed in its surface 273, and attached to the lid 278 by means of pivot pins 274. The hole 271 is countersunk from the interior side to accept a ball bearing 276, and the ball bearing 276 protrudes beyond the surface 273 of the pressure plate 272. The sloped characteristic of the countersunk hole 271 serves to constrain lateral movement of the ball bearing 276 with respect to the surface 273 of the pressure plate 272. The lateral motion of the ball bearing 276 may also be controlled by other means, such as projections (not shown) from the walls of the pressure plate 272. A compression spring 280 placed between the ball bearing 276 and the lid 278 forces the ball bearing 276 against the pressure plate 272.

In the point contact pressure system, the ball bearing 276 is used to apply force to the semiconductor die 282. As indicated in FIGS. 23 and 24, the surface 273 of the pressure plate 272 has a tapered characteristic. This reduces the possibility that the pressure plate 272 itself will apply uneven force to the die 282. The taper of the surface 273 of the pressure plate 272, ensures that the ball bearing 276 will be the first point of contact between the force delivery system and the semiconductor die 282.

In operation, a semiconductor die 282 is placed in the carrier 270, and the lid 278 is moved from an open position to a closed position. Because of the offset pivot and the tapered surface 273 of the pressure plate 272, the ball bearing 276 contacts the semiconductor die 282 first. The curved surface 273 of the ball bearing 276 allows it to accommodate any angulation, and the compression spring 280 provides compliance along the z-axis. Though the pressure plate 272 is able to pivot on the ball bearing 276, the magnitude of articulation required should be less than with the area contact designs, since the pressure plate 272 generally does not come into contact with the semiconductor die 282.

This point contact pressure system may be used with solder bumped die or other integrated circuits to improve the symmetry of force distribution across the entire area of the semiconductor die; i.e. along both the x- and y-axes. In addition, the surface area of contact between the semiconductor die and the pressure plate is reduced, which reduces the surface attraction force and vacuum between the die and pressure plate. Such "sticking" is undesirable, as it may cause the die to cling to the pressure plate surface when the lid is opened for unloading, resulting in improper positioning of the die.

Alternatively, area contact pressure systems such as those disclosed above or below may have pressure plates configured to reduce the surface area of contact. This could be accomplished by texturing the surface of the pressure plate with sharp points, grooves, cross-hatches, or other undulating characteristics.

FIGS. 27–31D illustrate another area contact pressure system, in the form of a reusable carrier 290 comprising a ball bearing loaded pressure plate 292. The pressure plate 292 is movably mounted to flanges 291 extending from the lid 298. Attached to the pressure plate 292 are pivot pins 294 in the form of two screws. The pivot pins 294 may also be formed or press-fit in place. These pins 294 extend through slots 293 in the flanges 291 and may be secured by means of nuts or other fasteners (not shown) on the interior sides of the flanges 291. The slots 293 are configured to permit the pins 294 to pivot, and move in a direction transverse to the surface 295 of the pressure plate 292 (along the z-axis). The pressure plate 292 has a depression 296 formed in it, which is shown in FIG. 29 in the form of a countersunk hole. A ball bearing 300 abuts the pressure plate 292 in the vicinity of the depression 296, and the depression 296 serves to control movement of the bearing 300 parallel to the surface of the pressure plate 292.

The pressure plate 292 is able to pivot about the ball bearing 300 in any direction. The bearing 300 is spring-loaded by means of a compression spring 302 placed between the ball bearing 300 and the lid 298, and is thereby forced against the pressure plate 292.

In this embodiment, the pivot pins 294 are offset toward the hinge 304 of the lid 298. Because the compression spring 302 is exerting force against the ball bearing 300 and pressure plate 292 through an axis spaced apart from the pivot point, this causes the pressure plate 292 to be tilted toward the base 306, as shown in FIGS. 30 and 31D. Thus, as the lid 298 is closed, the incident angle of the pressure plate 292 relative to the semiconductor die 308 is reduced, and the surface of the pressure plate 292 is substantially parallel to the surface of the semiconductor die 308. This reduction in incident angle allows force to be applied more uniformly to the die 308, reducing the possibility of die movement or flipping. The pivot pins 294 may be also placed in the centerline of the pressure plate 292, so that there is no offset, with the effect that the a incident angle of the pressure plate 292 with respect to the semiconductor die 308 will be greater.

When a semiconductor die 308 is placed in the carrier 290 and the lid 298 closed, the pressure plate 292 approaches the surface of the die 308 oriented in a nearly parallel fashion. The pressure plate 292 pivots about the ball bearing 300 to distribute force evenly over the surface of the die 308, and the spring 302 compresses to apply a controlled force to the die 308. As the lid 298 reaches the closed position, the latch 310 actuates to secure the lid 298.

In this embodiment, the latch 310 and latching surface 311 of the lid 298 have an improved configuration, as shown in FIGS. 27A–27C. The latching surface 311 has an angled portion 312 which protrudes above the latch 310 when the latching surface 311 is engaged by the latch 310. With the latch configuration shown in other embodiments, such as in FIG. 14, an upward force applied to the lid 298 would have a tendency to cause the latch 310 to pivot away, allowing the lid 298 to spring open. This is undesirable, as it increases the likelihood of accidental opening from jarring the die carrier. In the improved configuration shown, an upward force applied to the lid 298 causes it to rise slightly, until the angled portion 312 engages the upper surface 314 of the latch 310. At this point, the angled portion 312 exerts a downward force on the latch 310 and prevents it from continuing through its arc, thereby keeping the lid 298 shut. Further, the lower latching surface 316 of the lid 298 is angled, as is the corresponding latching surface 318 of the latch 310. This tends to direct any forces generated by lifting of the lid 298 away from the arc of the latch 310. This has the advantage of making the carrier more resistant to accidental opening from being jarred or dropped, and may be used with any reusable carrier, including the carriers described herein.

FIG. 34 shows an alternative arrangement to that shown in FIGS. 27–31 of an area contact pressure system, which has been designed to minimize the package height. Slots 350 in which shaft 352 rides are located in pressure foot 354, rather than in lid 356. Spring 358 is under the shaft 352 between the shaft 352 and bottom 360 of the pressure foot 354. Other than as shown and described, the construction and operation of the FIG. 34 embodiment is the same as that of the FIGS. 27–31D embodiment of the invention.

The above described force delivery systems may be designed as heat sinks for die thermal dissipation purposes. For example, the pressure plates, ball bearings, and other components may be made from a metal such as zinc or aluminum for better heat transfer capability and backside biasing, in which a bias voltage may be applied to the backside of the die. Further, although the systems have been described in terms of x-, y- and z-axes, it will be recognized that such systems may be implemented which do not necessarily operate along mutually orthogonal axes.

It should now be readily apparent that a novel reusable die carrier for burn-in and electrical testing capable of achieving the stated objects of the invention has been provided. The reusable carrier temporarily holds a semiconductor die. In one form, the reusable carrier temporarily holds a semiconductor die for burn-in and is also suitable for use in electrical test of the semiconductor die. This form of the invention provides a substantial savings for burn-in sockets where only a limited number of pins are required for burn-in sockets, since extra contact pads can be provided in the reusable carrier for contacting an integrated circuit in the carrier for test. The process uses the reusable carrier for burn-in evaluation of a semiconductor die, and optionally for electrical test of the semiconductor die. The reusable carrier can be used with conventional burn-in systems and burn-boards in the process. The reusable carrier can readily be provided in different sizes for different size die and different numbers of pins. One burn-in board design might be used with a variety of integrated circuit die in the die carrier by substrate redesign. The proper direction of signals to the different integrated circuit die can be accomplished by the use of different substrates in the die carrier. This capability means that it is possible to move toward a universal burn-in board. In the reusable carrier the semiconductor die is environmentally protected.

It should further be apparent to those skilled in the art that various changes in form and details of the invention as shown and described may be made. For example, the balance block and pressure plates which contact the surface of the die may have surface irregularities formed therein to reduce sticking between the plates and the die. It is intended that such changes be included within the spirit and scope of the claims appended hereto.

What is claimed is:

1. A reusable carrier for an unpackaged semiconductor die, comprising:

a base having a plurality of carrier contacts for electrical connection of the semiconductor die external to the reusable carrier;

a plurality of electrically conductive traces on the base, having first ends connected to the carrier contacts and having second ends positioned to engage die contacts on the semiconductor die;

at least one alignment member on the base, having an alignment surface for engaging a portion of the semiconductor die to automatically and precisely align the die so that the die contacts engage the second ends of the traces;

a lid configured for removable positioning over the base to cover and engage the semiconductor die and attached to the base by at least one hinge;

a vacuum port extending through the base to engage the semiconductor die while the semiconductor die is engaged by the alignment member; and means for fastening the lid in position over the base.

2. The reusable carrier as recited in claim 1, wherein the base comprises a rigid member having an upper surface and a flexible substrate for the semiconductor die over the upper surface.

3. The reusable carrier as recited in claim 2, wherein the reusable carrier additionally comprises a layer of resilient compliant material between the flexible substrate and the base.

4. The reusable carrier as recited in claim 3, wherein the layer of resilient compliant material comprises a plurality of individual compliant pieces.

5. The reusable carrier as recited in claim 1, wherein the means for fastening the lid in position over the base comprises a latch configured for holding engagement of the base.

6. The reusable carrier as recited in claim 1, additionally comprising a means on the lid for biasing the semiconductor die against the second ends of the traces.

7. The reusable carrier as recited in claim 6, wherein the lid has an inner surface and the means for biasing the semiconductor die against the second ends of the plurality of electrically conductive traces comprises a spring positioned to push against the inner surface of the lid.

8. The reusable carrier as recited in claim 1, wherein the plurality of electrically conductive traces is configured to engage the die contacts of an integrated circuit as the semiconductor die.

9. The reusable carrier as recited in claim 1, wherein the alignment member aligns the die so that the die contacts engage the second ends before the lid is positioned over the base.

10. The reusable carrier as recited in claim 9 in which the alignment member comprises a plurality of posts extending from the base each having a surface configured to engage the die.

11. The reusable carrier as recited in claim 9 in which the alignment member comprises a plate with an aperture dimensioned and configured to engage a plurality of sides of the die.

12. The reusable carrier as recited in claim 11 in which the plate comprises a material having a thermal coefficient of expansion closely matching the thermal coefficient of expansion of the die.

13. The reusable carrier as recited in claim 9, wherein the base comprises a rigid member having an upper surface and a flexible substrate for the semiconductor die over the upper surface.

14. The reusable carrier as recited in claim 13, wherein the reusable carrier additionally comprises a layer of resilient compliant material between the flexible substrate and the base.

15. The reusable carrier as recited in claim 9, additionally comprising a means on the lid for biasing the semiconductor die against the second ends of the traces.

16. The reusable carrier as recited in claim 15, wherein the lid has an inner surface and the means for biasing the semiconductor die against the second ends of the traces comprises a spring attached to the inner surface of the lid.

17. The reusable carrier as recited in claim 9, wherein the plurality of electrically conductive traces is configured to engage the die contacts of an integrated circuit as the semiconductor die.

18. The carrier as recited in claim 1, wherein the lid includes a pressure plate having a die-contacting surface with an undulating characteristic.

19. A carrier for holding an unpackaged semiconductor die, comprising:

a base;

a lid which is attached to the base by at least one hinge and removably positionable over the base to cover the die; and means for uniform delivery of force to the die along at least one axis in a major plane of the die received within the carrier, the force delivery means comprising a balance block mounted on a rotating pin pivotally mounted to the lid, and as the balance block engages the die, the balance block is able to pivot about an axis of the rotating pin.

20. The carrier as recited in claim 19, wherein the base includes:

a plurality of carrier contacts for electrical connection of the die external to the carrier; and a plurality of electrically conductive traces having first ends connected to the carrier contacts and having second ends positioned to engage die contacts on the die.

21. The carrier as recited in claim 20, further comprising at least one alignment member which automatically and precisely positions the die so that the die contacts engage the second ends of the traces.

22. The carrier as recited in claim 21 in which the alignment member comprises a plurality of posts extending from the base each having a surface configured to engage the die.

23. The carrier as recited in claim 21 in which the alignment member comprises a plate with an aperture dimensioned and configured to engage a plurality of sides of the die.

24. The carrier as recited in claim 23 in which the plate comprises a material having a thermal coefficient of expansion closely matching the thermal coefficient of expansion of the die.

25. The carrier as recited in claim 20, further comprising a vacuum port extending through the base to secure the die when the die is received in the base and when the lid is opened with the die in place.

26. The carrier as recited in claim 20, further comprising means for securing the lid in position over the base.

27. The carrier as recited in claim 19, wherein the force delivery means is attached to the lid and engages the die as the lid is moved to a closed position over the base.

28. The carrier as recited in claim 19, wherein the rotating pin is slidably mounted to the lid, and wherein the force delivery means further comprises a spring configured to bias the rotating pin away from the lid, so that the balance block exerts force on the die when the lid is moved to the closed position over the base.

29. The carrier as recited in claim 28, wherein the axis of the rotating pin is parallel to the major plane of the die when the lid is moved to the closed position over the base.

30. The carrier as recited in claim 29, further comprising means for securing the lid in position over the base.

31. The carrier as recited in claim 19, wherein the balance block includes a pressure plate for contacting the die.

32. The carrier as recited in claim 31, wherein the pressure plate has a die-contacting surface with an undulating characteristic.

33. The carrier as recited in claim 19, wherein the force delivery means further comprises at least one pressure plate pivotally mounted to the balance block.

34. The carrier as recited in claim 33, wherein the at least one pressure plate pivots about a pressure plate axis parallel to the major plane of the die when the lid is moved to the closed position over the base.

35. The carrier as recited in claim 33, wherein the pressure plate axis is transverse to the axis of the rotating pin.

36. A carrier for holding a semiconductor die, comprising:
a base;
a lid which is removably positionable over the base to cover the die; and
means for uniform delivery of force to the die along at least one axis in a major plane of the die received within the carrier, the force delivery means comprising a balance block mounted on a rotating pin pivotally mounted to the lid, and as the balance block engages the die, the balance block is able to pivot about an axis of the rotating pin, the force delivery means further comprising at least two pressure plates and the pressure plates being independently articulate of each other, at least one of the pressure plates being pivotally mounted to the pressure block and pivotable about a pressure plate axis transverse to the axis of the rotating pin, the pressure plate axis further being parallel to the major plane of the die when the lid is moved to the closed position over the base.

37. The carrier as recited in claim 36, wherein the rotating pin is slidably mounted to the lid, and wherein the force delivery means further comprises a spring configured to bias the rotating pin away from the lid, so that the pressure plates exert force on the die when the lid is moved to the closed position over the base.

38. The carrier as recited in claim 37, wherein the axis of the rotating pin is parallel to the major plane of the die when the lid is moved to the closed position over the base.

39. The carrier as recited in claim 38, further comprising means for securing the lid in position over the base.

40. The carrier as recited in claim 33, wherein the pressure plate has a die-contacting surface with an undulating characteristic.

41. A carrier for holding an unpackaged semiconductor die, comprising:
a base;
a lid which is attached to the base by at least one hinge and removably positionable over the base to cover the die; and
means for uniform delivery of force to the die along at least one axis in a major plane of the die received within the carrier, the force delivery means comprising a pressure plate pivotally mounted, by means of a bearing about which the pressure plate articulates, to the lid for movement in at least one direction.

42. The carrier as recited in claim 41, wherein the bearing is substantially spherical.

43. The carrier as recited in claim 41, wherein the force delivery means further comprises a spring configured to bias the bearing away from the lid, so that the pressure plate exerts force on the die when the lid is moved to the closed position over the base.

44. The carrier as recited in claim 43, wherein the pressure plate is slidably and rotatably attached to the lid by means of at least one pivot pin.

45. The carrier as recited in claim 44, wherein the force delivery means further comprises means for tilting the pressure plate to reduce its incident angle to the die as the lid is moved to the closed position over the base.

46. The carrier as recited in claim 45, wherein the means for tilting the pressure plate to reduce its incident angle comprises the at least one pivot pin, with the at least one pivot pin having an axis which is transverse to and does not intersect a vector of force applied to the bearing by the spring.

47. The carrier as recited in claim 41, wherein the pressure plate has a die contacting surface with an undulating characteristic.

48. The carrier as recited in claim 19, wherein the carrier additionally comprises a layer of resilient compliant material between the lid and the base.

49. The carrier as recited in claim 48, wherein the layer of resilient compliant material comprises a plurality of individual compliant pieces.

50. A carrier for holding an unpackaged semiconductor die, comprising:
a base;
a lid which is removably positioned over the base to cover the die; and
means including a pressure plate pivotally mounted on the lid and having an aperture, and a bearing positioned in the aperture to engage the die when the lid is moved to a closed position over the base for symmetric delivery of force to the die.

51. The carrier as recited in claim 50, wherein the bearing protrudes through the hole to contact the die.

52. The carrier as recited in claim 51, wherein the pressure plate has a tapered die-facing surface configured so that the pressure plate does not contact the die.

53. The carrier as recited in claim 51, wherein the means for symmetric delivery of force further comprises a spring which biases the bearing against the pressure plate, so that the bearing exerts force on the die when the lid is moved to the closed position over the base.

54. The carrier as recited in claim 50, wherein the pressure plate is slidably and rotatably attached to the lid by means of at least one pivot pin.

55. The carrier as recited in claim 54, wherein the means for symmetric force delivery further comprises means for tilting the pressure plate to reduce its incident angle to the die as the lid is moved to the closed position over the base.

56. The carrier as recited in claim 55, wherein an axis of the pivot pin is transverse to and does not intersect a vector of force applied to the bearing by the spring.

57. A process for burn-in of an unpackaged semiconductor die, comprising:
providing a reusable carrier for the semiconductor die having a lid and a plurality of contacts on the carrier;
inserting the semiconductor die in the reusable carrier;
automatically aligning the semiconductor die with respect to the reusable carrier;
moving the lid to a closed position over the die;
establishing the semiconductor die at a desired temperature;
supplying a burn-in electrical input from a source external of the reusable carrier to a first set of a plurality of contacts and through the reusable carrier to the semiconductor die;
receiving electrical test output electrical signals in response to electrical test input electrical signals from the semiconductor die and through the reusable carrier from a second set of a plurality of contacts;
evaluating the electrical test output electrical signals to categorize the semiconductor die as good or defective;
maintaining the semiconductor die at the desired temperature during burn-in; and
removing the semiconductor die from the reusable carrier after burn-in.

58. The process of claim 57 in which the burn-in electrical input includes operating input signals for the semiconductor die.

59. The process of claim 58 additionally comprising receiving burn-in output electrical signals in response to the burn-in input electrical signals from the semiconductor die and through the reusable carrier from at least some of the plurality of contacts, and evaluating the burn-in output electrical signals to categorize the semiconductor die as good or defective.

60. The process of claim 57 additionally comprising the steps of removing the semiconductor die categorized as good from the reusable carrier and packaging the semiconductor die in a semiconductor die package.

61. The process of claim 57 in which the steps of supplying electrical test input signals, receiving electrical test output signals and evaluating the electrical test output electrical signals are carried out after inserting the semiconductor die in the reusable carrier and prior to burn-in.

62. The process of claim 61 in which the steps of supplying electrical test input signals, receiving electrical test output signals and evaluating the electrical test output electrical signals are performed after burn-in.

63. The process of claim 57 in which the steps of supplying electrical test input signals, receiving electrical test output signals and evaluating the electrical test output electrical signals are performed after burn-in.

* * * * *